(12) United States Patent
Kim et al.

(10) Patent No.: US 10,665,273 B2
(45) Date of Patent: May 26, 2020

(54) SEMICONDUCTOR MEMORY DEVICES, MEMORY SYSTEMS AND REFRESH METHODS OF THE SAME

(71) Applicant: Samsung Electronics Co., Ltd., Suwon-si (KR)

(72) Inventors: Joung-Yeal Kim, Yongin-si (KR); Ju-Suk Bang, Hwaseong-si (KR); Jung-Yong Lee, Hwaseong-si (KR); Chae-Il Lim, Hwaseong-si (KR); Yong-Gwon Jeong, Uiwang-si (KR)

(73) Assignee: SAMSUNG ELECTRONICS CO., LTD., Yeongtong-gu, Suwon-si, Gyeonggi-do (KR)

(*) Notice: Subject to any disclaimer, the term of this patent is extended or adjusted under 35 U.S.C. 154(b) by 0 days.

(21) Appl. No.: 16/140,053

(22) Filed: Sep. 24, 2018

(65) Prior Publication Data
US 2019/0189194 A1   Jun. 20, 2019

(30) Foreign Application Priority Data
Dec. 20, 2017 (KR) .................. 10-2017-0176061

(51) Int. Cl.
| | |
|---|---|
| *G11C 7/00* | (2006.01) |
| *G11C 11/406* | (2006.01) |
| *G11C 7/22* | (2006.01) |
| *G11C 11/408* | (2006.01) |
| *G11C 5/14* | (2006.01) |

(Continued)

(52) U.S. Cl.
CPC ............. *G11C 7/00* (2013.01); *G11C 5/148* (2013.01); *G11C 7/1063* (2013.01); *G11C 7/222* (2013.01); *G11C 11/4076* (2013.01); *G11C 11/4087* (2013.01); *G11C 11/40615* (2013.01); *G11C 11/40618* (2013.01); *G11C 11/40626* (2013.01)

(58) Field of Classification Search
CPC .......... G11C 11/40618; G11C 11/4076; G11C 7/1063; G11C 5/148; G11C 7/222; G11C 11/40626; G11C 11/40615; G11C 11/4087
See application file for complete search history.

(56) References Cited

U.S. PATENT DOCUMENTS

| | | |
|---|---|---|
| 5,365,487 A | 11/1994 | Patel et al. |
| 7,061,828 B2 | 6/2006 | Takatsuka et al. |
| 9,761,297 B1 | 9/2017 | Tomishimna |

(Continued)

*Primary Examiner* — Ajay Ojha
(74) *Attorney, Agent, or Firm* — Muir Patent Law, PLLC

(57) ABSTRACT

A memory controller transmits one or more command pairs of a self-refresh entry command and a subsequent self-refresh exit command to a semiconductor memory device during a refresh period. The semiconductor memory device includes a memory cell array including a plurality of memory cell rows each including a plurality of dynamic memory cells, and a refresh control circuit. The refresh control circuit performs a refresh operation on all of the memory cell rows during the refresh period in a self-refresh mode, the self-refresh mode of the refresh period being configured in response to each self-refresh entry command of the one or more command pairs, for each of the one or more command pairs, the memory controller sequentially transmits during the refresh period at least one self-refresh entry command and at least one self-refresh exit command to the semiconductor memory device separated by one or more time gaps.

19 Claims, 17 Drawing Sheets

(51) Int. Cl.
*G11C 7/10* (2006.01)
*G11C 11/4076* (2006.01)

(56) References Cited

U.S. PATENT DOCUMENTS

| | | |
|---|---|---|
| 2008/0239855 A1 | 10/2008 | Do |
| 2011/0255357 A1 | 10/2011 | Pelley, III et al. |
| 2012/0263003 A1* | 10/2012 | Sakakibara ....... G11C 11/40618 365/222 |
| 2013/0028034 A1* | 1/2013 | Fujisawa ........... G11C 11/40615 365/194 |
| 2014/0078846 A1 | 3/2014 | Shin et al. |
| 2014/0153350 A1 | 6/2014 | Boehm et al. |
| 2015/0003172 A1 | 1/2015 | Kim et al. |
| 2015/0134897 A1 | 5/2015 | Sriramagiri et al. |

* cited by examiner

| TIME | MR |
|---|---|
| $t_0$-$t_1$ | 010(MR2) |
| $t_1$-$t_2$ | 001(MR1) |
| $t_2$-$t_3$ | 010(MR2) |
| $t_3$-$t_4$ | 011(MR3) |

FIG. 17

| MR | REFRESH PERIOD MODE |
|---|---|
| 001 | 4 × tREFI |
| 010 | 2 × tREFI |
| 011 | 1 × tREFI |

SEMICONDUCTOR MEMORY DEVICES, MEMORY SYSTEMS AND REFRESH METHODS OF THE SAME

CROSS-REFERENCE TO RELATED APPLICATION(S)

This application claims the benefit of priority under 35 USC § 119 to Korean Patent Application No. 10-2017-0176061, filed on Dec. 20, 2017, in the Korean Intellectual Property Office, the content of which is incorporated herein in its entirety by reference.

BACKGROUND

Exemplary embodiments relate to memory devices, and more particularly to a semiconductor memory device, a memory system including the same and a method of operating a semiconductor memory device.

Along with rapid developments in capacities and speeds of semiconductor memory devices widely used in electronic devices, power consumption of semiconductor memory devices has been increasing. Particularly, in case of portable electronic devices, it is very important to reduce power consumption of semiconductor memory devices in portable electronic devices.

For example, a dynamic random access memory (DRAM) is a volatile semiconductor memory device which stores data by using charges stored in a capacitor. Since charges stored in a capacitor may be leaked in various ways as time passes, a DRAM has a finite data retention characteristic. For solving finite data retention, it is typically necessary for a DRAM to refresh periodically to charge/discharge a capacitor according to data stored in the DRAM.

However, the power is more consumed for performing a refresh operation in the DRAM as increasing the memory density. Thus, decreasing power consumption for high-density memory devices is important.

SUMMARY

According to exemplary embodiments, a memory system in includes a memory controller and a semiconductor memory device. The memory controller may transmit one or more command pairs of a self-refresh entry command and a subsequent self-refresh exit command to a semiconductor memory device during a refresh period. The semiconductor memory device includes a memory cell array and a refresh control circuit. The memory cell array includes a plurality of memory cell rows each including a plurality of dynamic memory cells. The refresh control circuit performs a refresh operation on all of the memory cell rows of the memory cell array during the refresh period in a self-refresh mode, the self-refresh mode of the refresh period being configured in response to each self-refresh entry command of the one or more command pairs, for each of the one or more command pairs, the memory controller is configured to sequentially transmit during the refresh period at least one self-refresh entry command and at least one self-refresh exit command to the semiconductor memory device separated by one or more time gaps. A first period of time equal to the sum of the one or more time gaps may be predetermined.

According to exemplary embodiments, a memory system includes at least one semiconductor memory device and a memory controller that controls the at least one semiconductor memory device. The memory controller transmits one or more command pairs of a self-refresh entry command and a subsequent self-refresh exit command to the at least one semiconductor memory device during a refresh period. The at least one semiconductor memory device includes a memory cell array and a refresh control circuit. The memory cell array includes a plurality of bank arrays each including a plurality of memory cell rows each including a plurality of dynamic memory cells. The refresh control circuit performs a refresh operation on all of the memory cell rows during the refresh period in a self-refresh mode, the self-refresh mode of the refresh period being configured in response to each self-refresh entry command of the one or more command pairs, for each of the one or more command pairs, the memory controller is configured to sequentially transmit during the refresh period at least one self-refresh entry command and at least one self-refresh exit command to the semiconductor memory device separated by one or more time gaps. When the memory controller transmits an all-bank self-refresh command with the self-refresh entry command to the semiconductor memory device, the refresh control circuit performs the refresh operation on all of the bank arrays. When the memory controller transmits a per-bank self-refresh command with the self-refresh entry command to the semiconductor memory device in the self-refresh mode, the refresh control circuit performs the refresh operation on each of the bank arrays.

According to exemplary embodiments, in a method of operating a memory system including a memory controller and a semiconductor memory device that including a memory cell array that includes a plurality of memory cell rows, and each of the memory cell rows includes a plurality of dynamic memory cells. The method includes transmitting, by the memory controller, one or more command pairs of a self-refresh entry command and a self-refresh exit command to the semiconductor memory device during a refresh period, performing, by a refresh control circuit of the semiconductor memory device, a refresh operation on all of the memory cell rows during the refresh period in a self-refresh mode, in response to each self-refresh entry command of the one or more command pairs, for each of the one or more command pairs, transmitting the one or more command pairs comprises transmitting sequentially during the refresh period, at least one self-refresh entry command and at least one self-refresh exit command to the semiconductor memory device separated by one or more time gaps. The first period of time equal to the sum of the one or more time gaps is predetermined.

Accordingly, a semiconductor memory device may perform refresh operation on all of memory cell rows using a self-refresh entry command and a self-refresh exit command to ensure an interval during which a self-refresh operation is performed on all of the memory cell rows without using auto refresh command. Therefore, the semiconductor memory device may reduce current consumption during the refresh operation.

BRIEF DESCRIPTION OF THE DRAWINGS

Illustrative, non-limiting exemplary embodiments will be more clearly understood from the following detailed description taken in conjunction with the accompanying drawings.

FIG. 16 is a table illustrating code signals in sensed temperature intervals according to exemplary embodiments.

FIG. 17 is a table illustrating a selection of the refresh period mode according to the code signal of the refresh clock generator in FIG. 6 according to exemplary embodiments.

DETAILED DESCRIPTION

Various exemplary embodiments will be described more fully hereinafter with reference to the accompanying drawings, in which some exemplary embodiments are shown.

Figure 1:
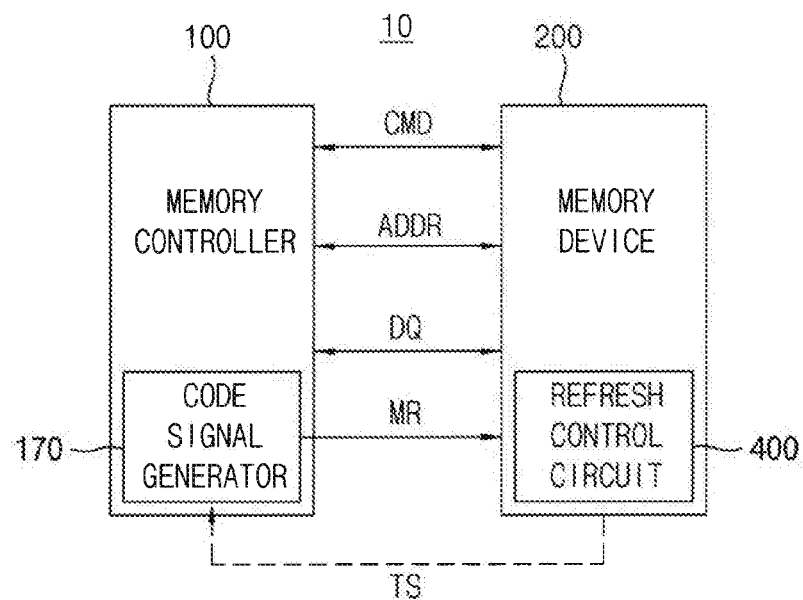
FIG. 1 is a block diagram illustrating a memory system according to exemplary embodiments.

FIG. 1 is a block diagram illustrating a memory system according to exemplary embodiments.

Referring to FIG. 1, a memory system 10 may include a memory controller 100 and a semiconductor memory device 200.

The memory controller 100 may control overall operation of the memory system 10. The memory controller 100 may control overall data exchange between an external host (not shown) and the semiconductor memory device 200.

For example, the memory controller 100 may write data in the semiconductor memory device 200 or read data from the semiconductor memory device 200 in response to request from the host. In addition, the memory controller 100 may issue operation commands to the semiconductor memory device 200 for controlling the semiconductor memory device 200.

In some embodiments, the semiconductor memory device 200 is a memory device including dynamic memory cells such as a double data rate (DDR) synchronous dynamic random access memory (SDRAM), low power double data rate 5 (LPDDR5) SDRAM, or a Rambus dynamic random access memory (RDRAM).

The memory controller 100 transmits a command CMD and an address (signal) ADDR to the semiconductor memory device 200 and exchanges data DQ with the semiconductor memory device 200, such as along command, address and data lines, respectively, of a bus connecting the semiconductor memory device 200 and memory controller 100.

The memory controller may include a code signal generator 170 and the code signal generator 170 may generate a code signal MR by sensing change of a temperature signal TS indicating an operating temperature of the semiconductor memory device 200 and may provide the code signal MR to the semiconductor memory device 200.

The semiconductor memory device 200 may include a refresh control circuit 400. The refresh control circuit 400 may sequentially receive a self-refresh entry command and a self-refresh exit command separated by a first time gap. In some examples, the semiconductor memory device 200 may perform a refresh operation on all of memory cell rows in the semiconductor memory device 200 in a self-refresh mode during a first interval corresponding to the first time gap (e.g., a first interval substantially the same in duration as the first time gap), in response to the self-refresh entry command.

In some examples, the semiconductor memory device 200 may perform a refresh operation on all of memory cell rows in the semiconductor memory device 200 during several spaced apart first intervals over a refresh period tREF. The first time gap may be predetermined and may be significantly less than a refresh period tREF in which all rows of the semiconductor memory device 200 should be refreshed. Thus, normal access operations (e.g., read and write operations) may be performed during a refresh period tREF in which all of the memory cell rows are refreshed in response to the self-refresh entry command received during that refresh period. During a refresh period tREF, the memory device 200 may perform access operations and may refresh all of its memory cell rows only by self refresh operations (i.e., auto-refresh operations and/or receiving refresh commands other than self refresh commands may be avoided during a refresh period tREF while still allowing access (read and write operations) to the memory device 200). The first time gap may be set by the memory controller and may be determined prior to issuance of the self-refresh entry command. The first time gap may be the same for all of several sequentially issued pairs of self-refresh entry command and a self-refresh exit command received over a certain duration.

Figure 2:
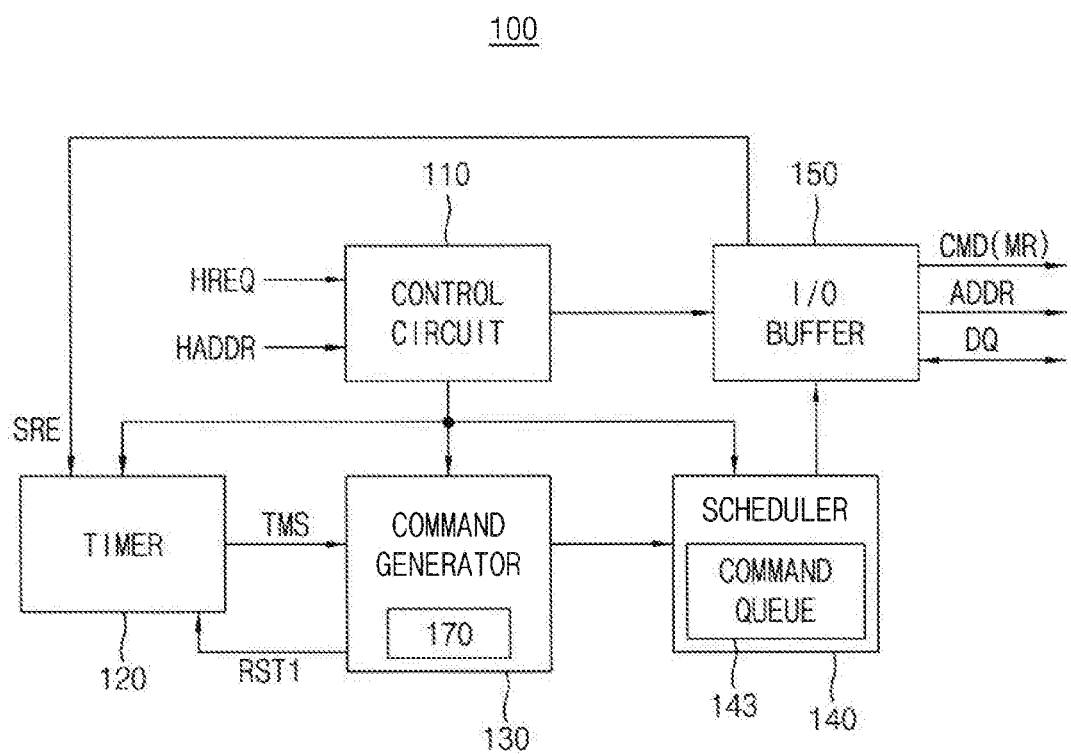
FIG. 2 is a block diagram illustrating an example of the memory controller in FIG. 1 according to exemplary embodiments.

FIG. 2 is a block diagram illustrating an example of the memory controller in FIG. 1 according to exemplary embodiments.

Referring to FIG. 2, the memory controller 100 may include a control circuit 110, a timer 120, a command generator 130, a scheduler 140 and an input/output (I/O) buffer 150. The scheduler 140 may include the command queue 143.

The timer 120 may provide a timing signal TMS to the command generator 130 under control of the control circuit 110 when a time interval corresponding to the first time gap elapses from a time point at which the timer 120 receives a self-refresh entry command SRE provided from the I/O buffer 150.

The command generator 130 may provide the scheduler 140 with the self-refresh entry command SRE and the self-refresh exit command SRX sequentially. In some examples, the self-refresh exit command SRX may be inserted in the front of the command queue in response to detecting the issuance of a self-refresh entry command SRE. Issuance of the self-refresh exit command SRX may be delayed by a first time gap after issuance of the self-refresh entry command SRE in response to timer 120. In addition, the command generator 130 may provide commands to the scheduler 140 under control of the control circuit 110 such that the semiconductor memory device 200 performs an active, refresh, read and write operations. The command generator 130 applies a reset signal RST1 to the timer 120 to reset the timer 120 when the command generator 130 receives the timing signal TMS from the timer 120. Operation of the timer 120 after reset may be initiated in response to issuance of a self-refresh entry command SRE by scheduler 140.

The scheduler 140 stores the commands from the command generator 130 and performs command scheduling. The scheduler 140 may perform the command scheduling such that any valid commands are not inserted between the self-refresh entry command SRE and the self-refresh exit command. After issuance of the refresh entry command SRE, the scheduler 140 may avoid issuance to the memory device 200 of any commands except a self refresh exit command SRX until after issuance of the self refresh exit command SRX.

The control circuit 110 receives a host request HREQ and a host address signal HADDR from the host to control the command generator 130 to generate the commands and the semiconductor memory device 200 may perform an active, refresh, read and write operations based on the commands.

The I/O buffer 150 may temporarily store signals to be transmitted to the semiconductor memory device 200 or transmitted from the semiconductor memory device 200. The memory controller 100 may transmit the data DQ, the address ADDR and the command CMD to the semiconductor memory device 200 through the I/O buffer 150. The command CMD may include the code signal MR.

The code signal generator 170 in FIG. 1 may be included in the command generator 130.

Figure 3:
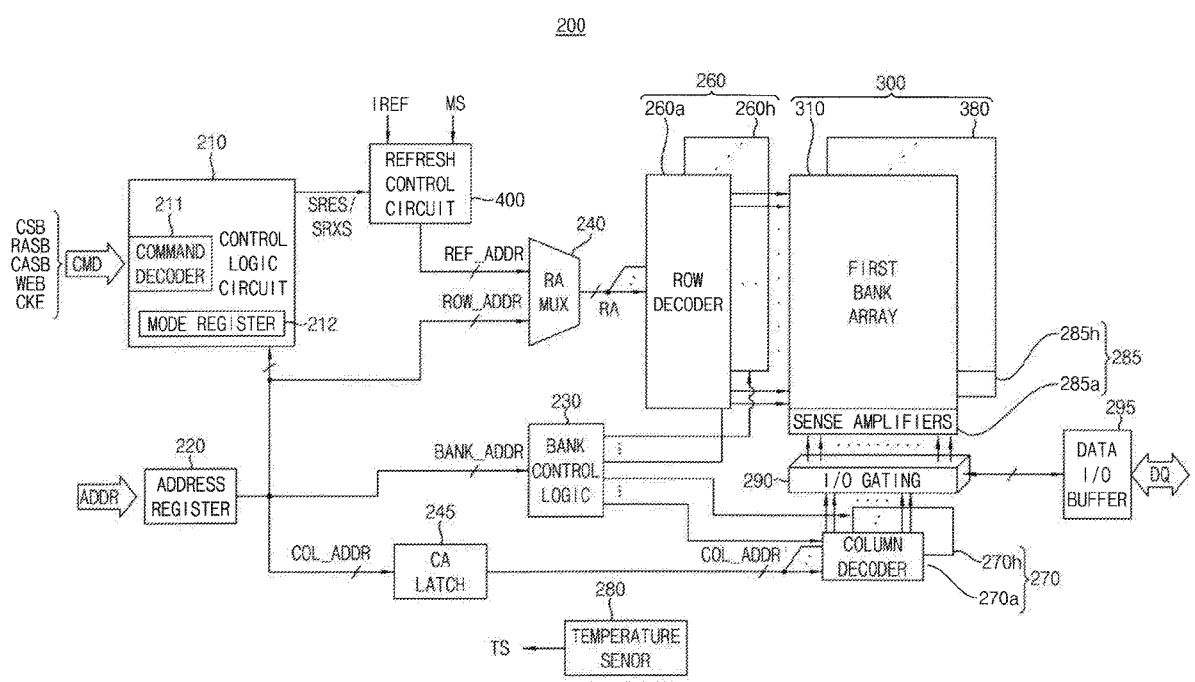
FIG. 3 is a block diagram illustrating an example of the semiconductor memory device in FIG. 1 according to exemplary embodiments.

FIG. 3 is a block diagram illustrating an example of the semiconductor memory device in FIG. 1 according to exemplary embodiments.

Referring to FIG. 3, the semiconductor memory device 200 may include a control logic circuit 210, an address register 220, a bank control logic 230, a row address multiplexer 240, a column address latch 245, a row decoder 260, a column decoder 270, a memory cell array 300, a sense amplifier unit 285, an input/output (I/O) gating circuit 290, a data input/output (I/O) buffer 295, a temperature sensor 280 and a refresh control circuit 400.

The memory cell array 300 may include first through eighth bank arrays 310~380. The row decoder 260 may include first through eighth bank row decoders 260a~260h respectively coupled to the first through eighth bank arrays 310~380, the column decoder 270 may include first through eighth bank column decoders 270a~270h respectively coupled to the first through eighth bank arrays 310~380, and the sense amplifier unit 285 may include first through eighth bank sense amplifiers 285a~285h respectively coupled to the first through eighth bank arrays 310~380.

The first through eighth bank arrays 310~380, the first through eighth bank row decoders 260a~260h, the first through eighth bank column decoders 270a~270h and first through eighth bank sense amplifiers 285a-285h may form first through eighth banks. Each of the first through eighth bank arrays 310~380 may include a plurality of dynamic memory cells formed near intersections between a plurality of word-lines and a plurality of bit-lines. Although the semiconductor memory device 200 is illustrated in FIG. 3 as including eight banks, the semiconductor memory device 200 may include any number of banks.

The address register 220 may receive an address ADDR including a bank address BANK_ADDR, a row address ROW_ADDR and a column address COL_ADDR from the memory controller 100. The address register 220 may provide the received bank address BANK_ADDR to the bank control logic 230, may provide the received row address ROW_ADDR to the row address multiplexer 240, and may provide the received column address COL_ADDR to the column address latch 245.

The bank control logic 230 may generate bank control signals in response to the bank address BANK_ADDR. One of the first through eighth bank row decoders 260a~260h corresponding to the bank address BANK_ADDR may be activated in response to the bank control signals, and one of the first through eighth bank column decoders 270a~270h corresponding to the bank address BANK_ADDR may be activated in response to the bank control signals.

The row address multiplexer 240 may receive the row address ROW_ADDR from the address register 220, and may receive a refresh row address REF_ADDR from the refresh control circuit 400. The row address multiplexer 240 may selectively output the row address ROW_ADDR or the refresh row address REF_ADDR as a row address RA. The row address RA that is output from the row address multiplexer 240 may be applied to the first through eighth bank row decoders 260a~260h.

The activated one of the first through eighth bank row decoders 260a~260h may decode the row address RA that is output from the row address multiplexer 240, and may activate a word-line corresponding to the row address RA. For example, the activated bank row decoder may apply a word-line driving voltage to the word-line corresponding to the row address RA.

The column address latch 245 may receive the column address COL_ADDR from the address register 220, and may temporarily store the received column address COL_ADDR. In some embodiments, in a burst mode, the column address latch 2550 may generate column addresses COL_ADDR' that increment from the received column address COL_ADDR. The column address latch 245 may apply the temporarily stored or generated column address COL_ADDR' to the first through eighth bank column decoders 270a~270h.

The activated one of the first through eighth bank column decoders 270a~270h may decode the column address COL_ADDR' that is output from the column address latch 245, and may control the input/output gating circuit 290 in order to input and/or output data corresponding to the column address COL_ADDR'.

The I/O gating circuit 290 may include a circuitry for gating input/output data. The I/O gating circuit 290 may further include read data latches for storing data that is output from the first through eighth bank arrays 310~380, and write drivers for writing data to the first through eighth bank arrays 310~380.

Data DQ to be read from one bank array of the first through eighth bank arrays 310~380 may be sensed by a sense amplifier coupled to the one bank array from which the data is to be read, and may be stored in the read data latches. The data DQ stored in the read data latches may be provided to the memory controller 100 via the data I/O buffer 295. Data DQ to be written in one bank array of the first through eighth bank arrays 310~380 may be provided to the data I/O buffer 295 from the memory controller 100. The write driver in the data I/O buffer 295 may write the data DQ in one bank array of the first through eighth bank arrays 310~380.

The control logic circuit 210 may control operations of the semiconductor memory device 200. For example, the control logic circuit 210 may generate control signals for the semiconductor memory device 200 in order to perform a write operation or a read operation. The control logic circuit 210 may include a command decoder 211 that decodes the command CMD received from the memory controller 100 and a mode register 212 that sets an operation mode of the semiconductor memory device 200.

For example, the command decoder 211 may generate the control signals corresponding to the command CMD by decoding a write enable signal WEB, a row address strobe signal RASB, a column address strobe signal CASB, a chip selection signal CSB, a clock enable signal CKE, etc. As an example, the command decoder 211 may generate an internal self-refresh entry command (or an internal self-refresh entry signal) SRES and an internal self-refresh exit command (or an internal self-refresh exit signal) SRXS by decoding the write enable signal WEB, the row address strobe signal RASB, the column address strobe signal CASB, the chip selection signal CSB, the clock enable signal CKE, etc. (on which the external self-refresh entry command SRE and self-refresh exit command SRX are provided by memory controller 100). As another example, the command decoder 211 may generate the internal self-refresh entry signal SRES and the internal self-refresh exit signal SRXS by combination of other signals including address signals.

When the semiconductor memory device 200 performs a self-refresh operation, the semiconductor memory device 200 uses an internal clock signal generated in the semiconductor memory device 200 instead of a clock signal of the memory controller 100, and thus the memory controller 100 may not know operating state of the semiconductor memory device 200 that performs the self-refresh operation. Therefore, after the memory controller 100 sends the self-refresh exit command SRX to the semiconductor memory device 200, the memory controller 100 stands by for a maximum time required for exiting from a self-refresh mode before sending another valid command (e.g., an active, a read, or a write command) to the semiconductor memory device 200.

The maximum time required for exiting from the self-refresh mode may be defined in the Joint Electron Device Engineering Council (JEDEC) standards. For example, with reference to the JEDEC standards for Low Power Double Data Rate 2 (LPDDR2), the maximum time required for exiting from a self-refresh mode is defined as a 'self-refresh exit to next valid command delay' by using the symbol "tXSR." Also, tXSR is defined as "tRFCab+10 ns."

In this regard, tRFCab is a symbol of a parameter called a refresh cycle time and is 90 ns in the case of LPDDR2 of 64 Mb, 128 Mb, 256 Mb, and 512 Mb. However, in the case of LPDDR2 of 1 Gb, 2 Gb, and 4 Gb, tRFCab is 130 ns and is 210 ns in the case of LPDDR2 of 8 Gb. In the case of DDR3, tRFCab is 90 ns for 512 Mb, 110 ns for 1 Gb, 160 ns for 2 Gb, 300 ns for 4 Gb, and 350 ns for 8 Gb. In other words, since the memory controller 100 does not know the operation states of the semiconductor memory device 200, after the memory controller 100 sends external command signals corresponding to the self-refresh exit command, stands by for a time of tXSR, and then sends a next valid command (e.g., an active, a read, or a write command). For example, the next valid command may also be provided with a memory address.

If external command signal CKE transitions from a high level to a low level when the external command signals CSB, RASB, and CASB are at a low level, and the external command signal WEB is at a high level, the self-refresh entry command SRE is decoded (this may also be described as the self-refresh entry command SRE being received). If the external command signal CKE transits from the low level to the high level when the external command signals CASB, RASB, and WEB are at a high level, the self-refresh exit command SRX is decoded (this may also be described as the self-refresh exit command SRX being received).

The control logic circuit 210 may provide the refresh control circuit 400 with an internal self-refresh entry signal SRES corresponding to the self-refresh entry command SRE and an internal self-refresh exit signal SRXS corresponding to the self-refresh exit command SRX.

The refresh control circuit 400 may perform counting operation to output the refresh row address REF_ADDR in a self-refresh mode in response to the internal self-refresh entry signal SRES during a first interval corresponding to the time internal between the internal self-refresh entry signal SRES and the internal self-refresh exit signal SRXS.

The temperature sensor 280 senses the operating temperature of the semiconductor memory device 200 and may provide the code signal generator 170 in the memory controller 100 with a temperature signal TS indicating the operating temperature of the semiconductor memory device 200.

The code signal generator 170 may generate the code signal MR in response to the temperature signal TS and may provide the code signal MR to the command generator 130. The command generator 130 may provide the command CMD including the code signal MR to the semiconductor memory device 200. Thus, the mode register 212 of the semiconductor memory device 200 is set a refresh interval tREFI in response to the code signal MR, and a refresh period mode of the refresh control circuit 400 is set by the mode register 212.

Figure 4A:
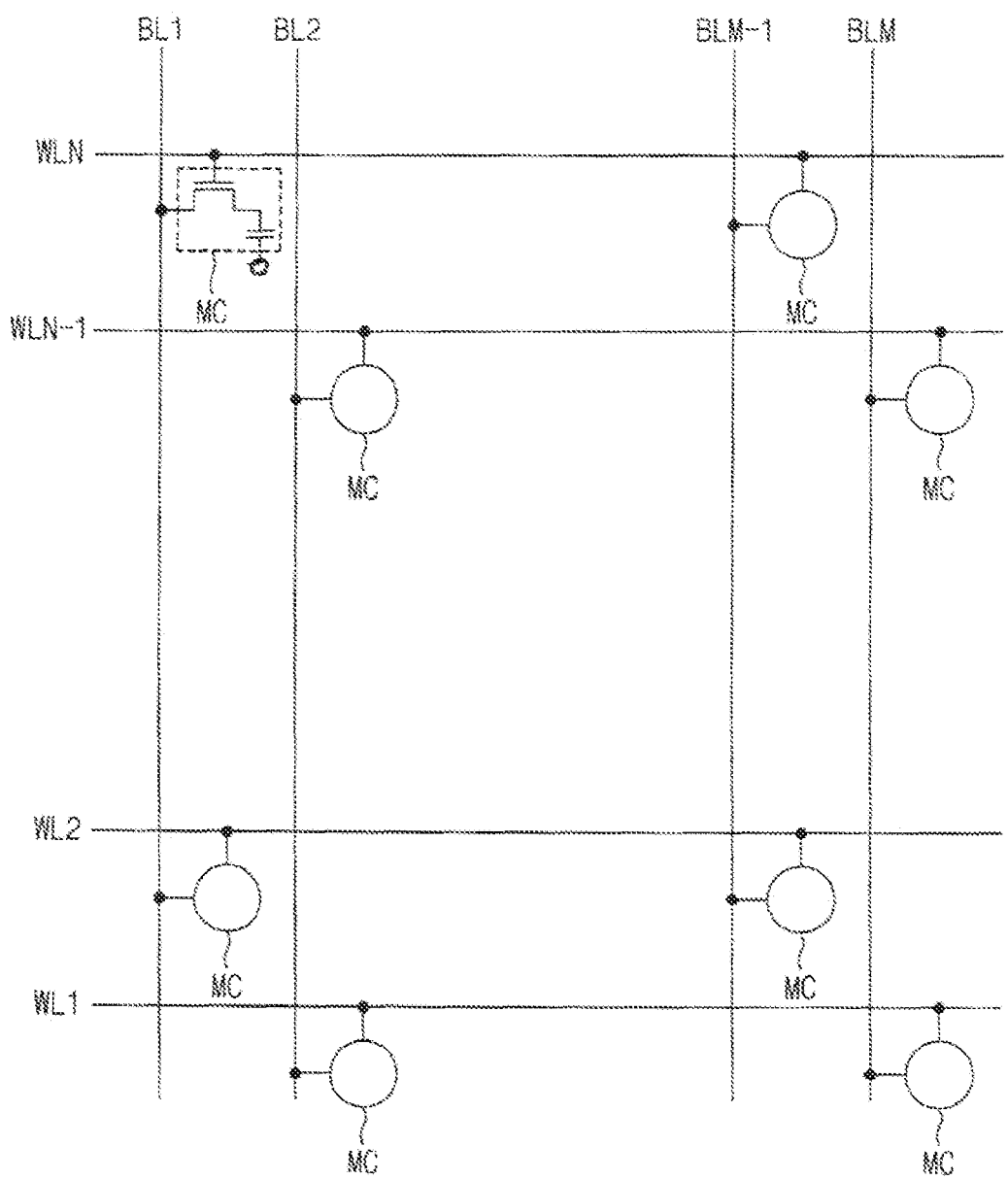
FIG. 4A illustrates the first bank array in the semiconductor memory device of FIG. 3.

FIG. 4A illustrates the first bank array in the semiconductor memory device of FIG. 3.

Referring to FIG. 4A, the first bank array 310 may include a plurality of word-lines WL1~WLN, a plurality of bit-lines BL1~BLM, and a plurality of memory cells MCs disposed near intersections between the word-lines WL1~WLN and the bit-lines BL1~BLM. In one embodiment, each of the plurality of memory cells MCs may include a dynamic random access memory (DRAM) cell structure.

The plurality of word-lines WL1~WLN to which the plurality of memory cells MCs are connected may be defined as rows of the first bank array 310, and the plurality of bit-lines BL1~BLM to which the plurality of memory cells MCs are connected may be defined as columns of the bank array. Memory cells coupled to each of word-lines WL1~WLN may be defined as a memory cell row and memory cells coupled to each of bit-lines BL1~BLM may be defined as a memory cell column.

Figure 4B:
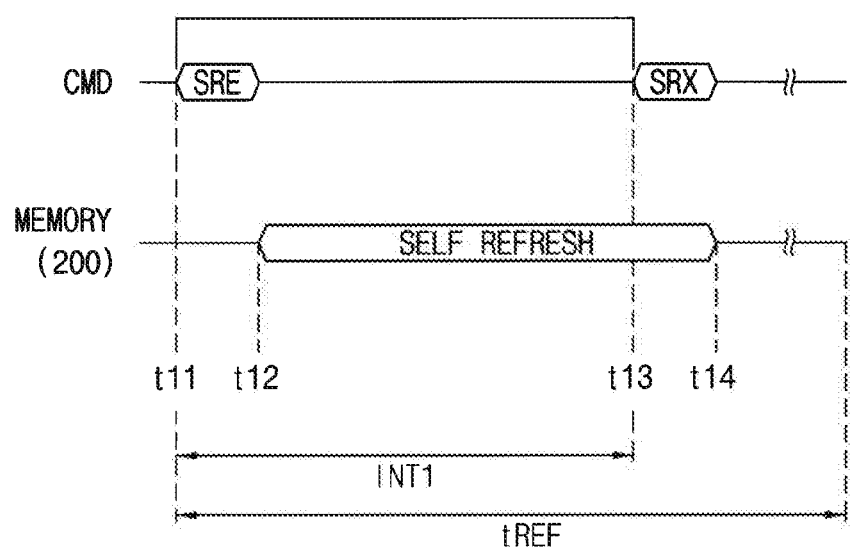
FIG. 4B illustrates that a self-refresh operation is performed in the memory system of FIG. 1.

FIG. 4B illustrates that a self-refresh operation is performed in the memory system of FIG. 1.

Referring to FIGS. 1 and 4B, the memory controller 100 transmits the self-refresh entry command SRE to the semiconductor memory device 200 at a time point t11, and transmits the self-refresh exit command SRX to the semiconductor memory device 200 at a time point t13.

In example embodiments, the memory controller 100 may transmit a sequential pair of the self-refresh entry command SRE and the self-refresh exit command SRX during a refresh period tREF only one time or may transmit several sequential pairs of the self-refresh entry command SRE and the self-refresh exit command SRX during the refresh period tREF. As an example, each of these sequential pairs may be a self-refresh entry command SRE and subsequent self-refresh exit command SRX may be separated by the same predetermined first interval INT1. For example, all of the memory cell rows of the memory cell array 300 may be refreshed every the refresh period tREF (e.g., 32 ms, 64 ms, 128 ms, or the like). In the example when only one pair of a self-refresh entry command SRE and self-refresh exit command SRX is issued during a refresh period tREF, the semiconductor memory device 200 performs the self-refresh operation on all of the memory cell rows during a single self refresh mode during the refresh period tREF, in this example, during a time interval between a time point t12 and a time point t14. In some examples, the first interval INT1 may be fixed by a specification (e.g., a user manual) regardless of the operating temperature of the semiconductor memory device 200.

In other example embodiments, the memory controller 100 may sequentially transmit several pairs of the self-refresh entry command SRE and the self-refresh exit command SRX during the refresh period tREF, with each pair of the self-refresh entry command SRE and the self-refresh exit command SRX being separated by a predetermined interval.

In some examples, the interval for each sequential pair of a self-refresh entry command SRE and a self-refresh exit command SRX may be predetermined and the same, however, in other examples, SRE/SRX pair may be separated by different intervals and such different intervals may or may not be predetermined. For example, the memory controller 100 sequentially transmits a first self-refresh entry command SRE and a first self-refresh exit command SRX by a first interval INT11 and a second self-refresh entry command SRE followed a second self-refresh exit command SRX by a second interval INT12 during the refresh period tREF. The period of time of sum of the first and second intervals INT11 and INT12 may be predetermined, however, the first interval INT11 may be selected by the memory controller 100 in response to a number of outstanding requests received by a host and/or a known access schedule of the host (such as an application processor) and thus may be set by a user. The second interval INT12 may be later set during the refresh period tREF as the predetermined period of time minus INT11.

In example embodiments, the sum of all intervals between sequential SRE/SRX command pairs during a refresh period tREF may be fixed regardless of the operating temperature. For example, the memory controller 100 may provide a sum of all intervals between sequential SRE/SRX command pairs during a refresh period tREF at the operating temperature 35° C. greater than that provided at the operating temperature 70° C. This sum of all intervals between sequential SRE/SRX command pairs during a refresh period tREF may be set equal to a refresh cycle time tRFC×(the number of rows of the memory device 200)/(the number of rows that may be refreshed at the same time, such as the number of banks). The refresh cycle time tRFC may be the minimum time between which two sequential refresh operations may be performed. The refresh cycle time may be adjusted in response to the operating temperature.

Figure 5:
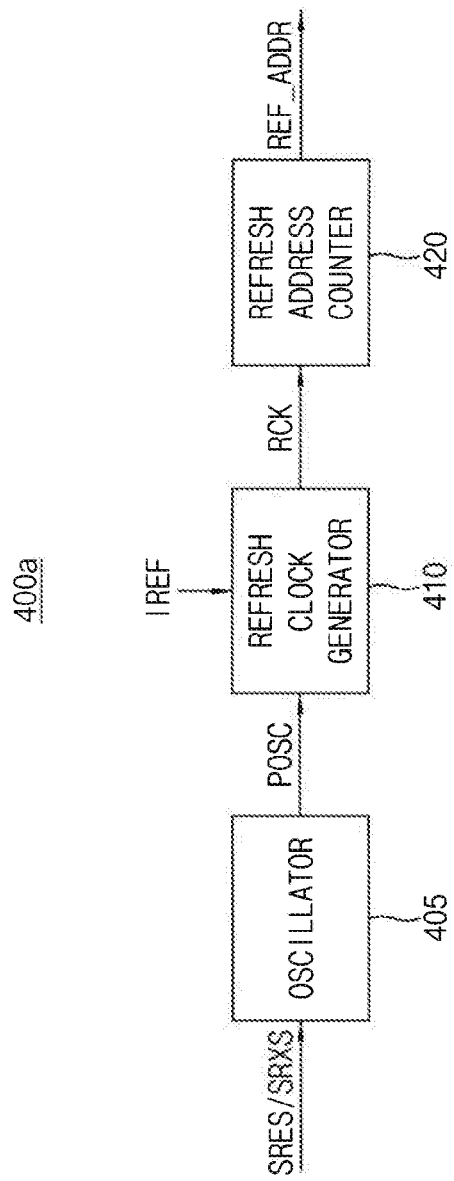
FIG. 5 is a block diagram illustrating an example of the refresh control circuit in the semiconductor memory device of FIG. 3 according to exemplary embodiments.

FIG. 5 is a block diagram illustrating an example of the refresh control circuit in the semiconductor memory device of FIG. 3 according to exemplary embodiments.

Referring to FIG. 5, a refresh control circuit 400a may include an oscillator 405, a refresh clock generator 410 and a refresh address counter 420.

The oscillator 405 may be enabled to generate an oscillation signal POCS in response to the internal self-refresh entry signal SRES from the control logic circuit 210 and may be disabled in response to the internal self-refresh exit signal SRXS from the control logic circuit 210. The oscillator 405 may be enabled to generate the oscillation signal POCS during the first interval when the semiconductor memory device 200 enters into a self-refresh mode.

Groups of the memory cell rows of the memory cell array 300 may be refreshed according to a refresh interval tREFI (e.g., 3.9 us, 7.8 us, 15.6 us, or the like) during the refresh period tREF (e.g., 32 ms, 64 ms, 128 ms, or the like). For example, N groups of M memory cell rows may be sequentially refreshed over a refresh period tREF, with a group being refreshed every tREFI (where N×M equals the number of memory cell rows of the memory device 200).

The refresh clock generator 410 may generate a refresh clock signal RCK in response to a refresh control signal IREF from the control logic circuit 210. In example embodiments, the control logic circuit 210 may generate the refresh control signal IREF to have the refresh interval tREFI having a variable period based on the code signal MR. Thus, the semiconductor memory device 200 may perform a refresh operation on all of the memory rows of the memory cell array 300 according to a variable time period (i.e., a different refresh interval tREFI) based on the operating temperature of the semiconductor memory device 200.

The refresh address counter 420 may generate the refresh row address REF_ADDR designating a memory cell row to be refreshed at every rising edge of the refresh clock signal RCK by performing a counting operation in response to the refresh clock signal RCK.

When the semiconductor memory device 200 performs the self-refresh operation in response to the self-refresh entry command SRE, the refresh clock generator 410 may generate the refresh clock signal RCK toggling with different refresh interval tREFI in response to the refresh control signal IREF. The refresh clock generator 410 may generate the refresh clock signal RCK in order to decrease the refresh interval according to increasing the operating temperature of the semiconductor memory device 200.

In some examples, when the semiconductor memory device 200 performs self-refresh operations based with intervals (either individually or together) between sequential SRE/SRX command pair(s) during a refresh period tREF being predetermined and the semiconductor memory device 200 continues to be accessed outside of the self-refresh modes corresponding to the SRE/SRX command pair(s), IREF may be set to a refresh cycle time tRFC so that sequential refresh operations are performed without delay (e.g., in a burst refresh operation for a group of rows, which may be all rows of the semiconductor memory device 200 or one of N groups of M rows as discussed herein). However, if it is determined that no access has occurred or based on user settings, determined that no access will occur to the semiconductor memory device 200, IREF may be increased (e.g., to tREFI) so that each subsequent refresh operation is spaced apart with a delay inserted therebetween to distribute refresh operations evenly across the refresh period tREF. In this latter self refresh operations, the semiconductor memory device 200 may enter a sleep mode in which a DLL (or PLL or other circuitry) of the semiconductor memory device 200 is turned off to conserve power, and in addition, the spacing of the subsequent SRX command from the previous SRE command may not be a predetermined interval but may be a function of a request from a host. The subsequently received SRX command may act to turn on the DLL (or PLL) and wake the semiconductor memory device 200 and exit self refresh mode.

Figure 6:
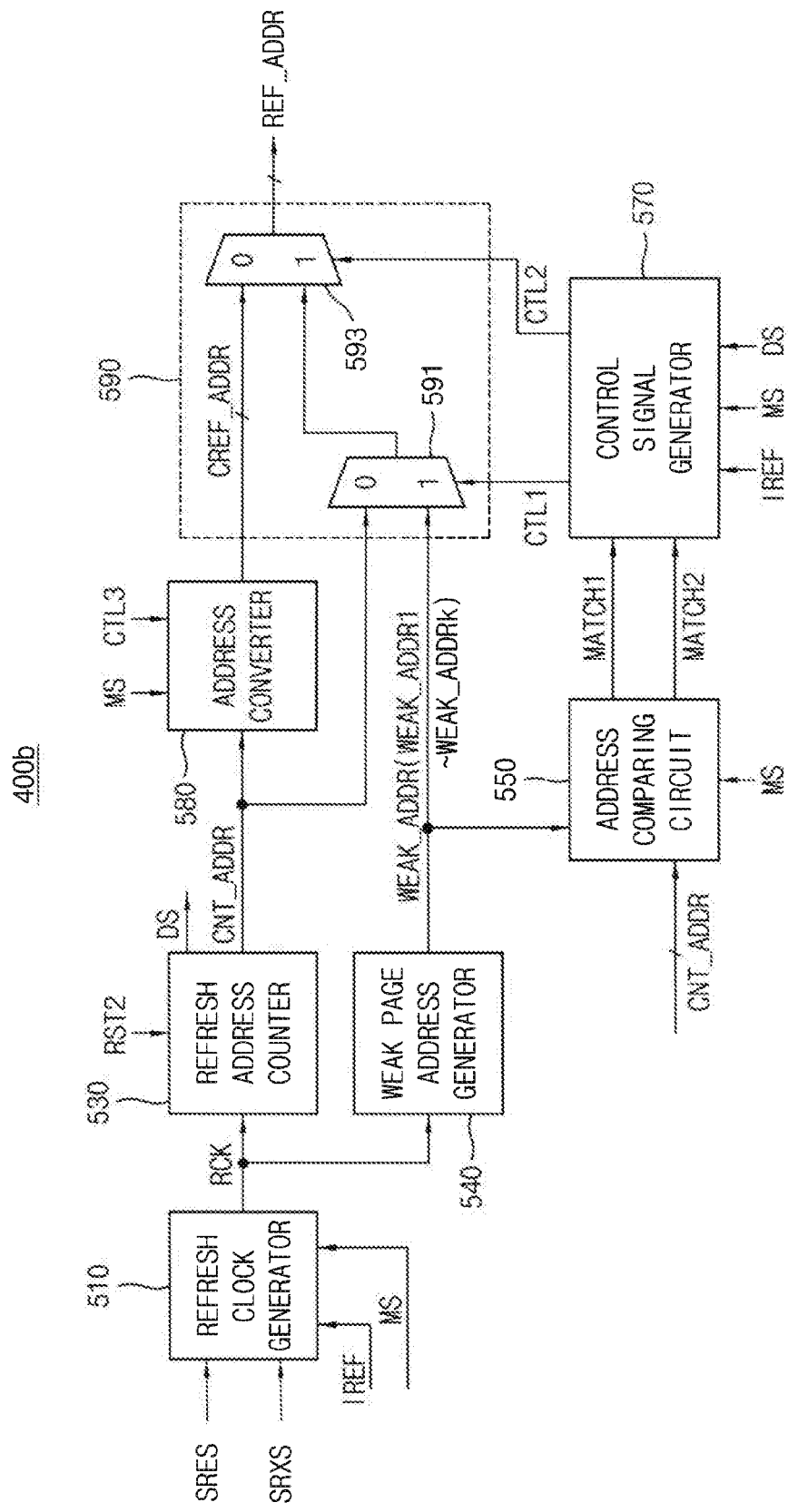
FIG. 6 is a block diagram illustrating another example of the refresh control circuit in the semiconductor memory device of FIG. 3 according to exemplary embodiments.

FIG. 6 is a block diagram illustrating another example of the refresh control circuit in the semiconductor memory device of FIG. 3 according to exemplary embodiments.

Referring to FIG. 6, a refresh control circuit 400b may include a refresh clock generator 510, a refresh address counter 530, a weak page address generator 540, an address comparing circuit 550, a control signal generator 570, an address converter 580, and a refresh address output circuit 590.

The refresh clock generator 510 may be enabled in response to the internal self-refresh entry signal SRES from the control logic circuit 210 and may be disabled in response to the internal self-refresh exit signal SRXS from the control logic circuit 210. The refresh clock generator 510 may generate a refresh clock signal RCK in response to a refresh control signal IREF and a mode signal MS. The control logic circuit 210 may generate the refresh control signal IREF, and the mode signal MS based on a command or a signal from the memory controller 100.

The refresh control signal IREF may direct an auto refresh mode or a self-refresh mode based on the command from the memory controller 100. In the auto refresh mode, the refresh control circuit 400b may perform a normal refresh operation on the memory cell rows in the memory cell array 300 in response to a refresh command from the memory controller 100. In the self-refresh mode, the refresh control circuit 400b may perform the normal refresh operation on the memory cell rows in the memory cell array 300 in response to stand-by signal or a sleep mode signal from the memory controller 100.

The refresh control signal IREF may designate a refresh period mode based on the code signal MR provided from the memory controller 100. For example, the refresh period mode corresponds to one of the refresh period tREF (e.g., 32 ms, 64 ms, 128 ms, or the like).

In addition, the mode signal MS may direct whether a weak self-refresh operation on one or more weak pages is performed in parallel with the normal self-refresh operation or sequentially after the normal refresh operation. For example, when the mode signal MS has a first logic level (logic high level), the refresh control circuit 400b may perform the weak self-refresh operation in parallel with the normal self-refresh operation (parallel refresh mode). When the mode signal MS has a second logic level (logic low level), the refresh control circuit 400b may perform the weak self-refresh operation after the normal self-refresh operation is completed (sequential refresh mode). The mode register 212 may provide the mode signal MS to the refresh control circuit 400b.

It is generally necessary to refresh a weak cell of the weak page having a weak retention characteristic more frequently than a normal cell, whereas a good cell having an excellent retention characteristic may have a longer refresh period than the normal cell.

The refresh clock generator 510 may change a period of the refresh clock signal RCK in response to the refresh control signal IREF and the mode signal MS. For example, when the mode signal MS indicates the sequential refresh mode, the refresh clock generator 510 may decrease a period of the refresh clock signal RCK.

When the period of the refresh clock signal RCK is decreased, a refresh interval tREFI is also decreased. Therefore, the refresh control circuit 400b may perform the normal self-refresh operation and the weak self-refresh operation sequentially within a refresh period tREF defined in the specification of the semiconductor memory device 200. For example, the weak pages are refreshed at least two times during the refresh period tREF.

The refresh address counter 530 may generate a counting address CNT_ADDR designating respective memory cell rows by performing a counting operation at the period of the refresh clock signal RCK. The refresh address counter 530 may output a done signal DS upon the refresh address counter 530 outputting the maximum value of the counting address CNT_ADDR.

The control logic circuit 210 may provide a reset signal RST2 to the refresh address counter 530 during a power-up sequence and the refresh address counter 530 may be reset to initialize the value of counting address CNT_ADDR in response to the reset signal RST2. The weak page address generator 540 may store weak page addresses of the weak pages and may output a weak page address WEAK_ADDR.

The address comparing circuit 550 is enabled when the mode signal MS has a first logic level (when the mode signal MS indicates the parallel refresh mode) and may compare each of the weak page addresses WEAK_ADDR1~WEAK_ADDRK (K is a natural number greater than one) with the counting address CNT_ADDR to provide a first match signal MATCH1 and the second match signal MATCH2.

When each bit of the counting address CNT_ADDR matches with each bit of one of the weak page addresses WEAK_ADDR1~WEAK_ADDRK, each of the first and second match signals MATCH1 and MATCH2 has a first logic level. When each bit of the counting address CNT_ADDR matches with each bit of one of the weak page addresses WEAK_ADDR1~WEAK_ADDRK except at least one bit such as most significant bit (MSB), the first match signal MATCH1 has a second logic level and the second match signal MATCH2 has a first logic level.

The control signal generator 570 may generate a plurality of control signals CTL1, CTL2 and CTL3 based on the refresh control signal IREF, the mode signal MS and the done signal DS. The control signal generator 570 may output the first control signal CTL1 and the second control signal CTL2 to the refresh address output circuit 590 and may output the third control signal CTL3 to the address converter 580.

When the refresh control signal IREF indicates a first refresh period mode (e.g., tREF1) of at a first operating temperature and the mode signal MS indicates the parallel refresh mode of the weak refresh operation, the control signal generator 570 may output the second control signal CTL2 and the third control signal CTL3 with a second logic level. Thus, the refresh address output circuit 590 may output the changed refresh row address CREF_ADDR as the refresh row address REF_ADDR.

When the refresh control signal IREF indicates the first refresh period mode and the mode signal MS indicates the sequential refresh mode of the weak refresh operation, the control signal generator 570 may output the second control signal CTL2 with a first logic level and may output the first control signal CTL1 with a second logic level. Thus, the refresh address output circuit 590 may output the counting address CNT_ADDR as the refresh row address REF_ADDR. And then the control signal generator 570 may output the first control signal CTL1 with transition to a first logic level in response to the done signal DS transitioning to a first logic level. Thus, the refresh address output circuit 590 may output the weak page address WEAK_ADDR (WEAK_ADDR1~WEAK_ADDRK) as the refresh row address REF_ADDR.

The address converter 580 is activated when the mode signal MS indicates the parallel refresh mode, and may do-not-care processing on at least one bit of the counting address CNT_ADDR such as MSB of the counting address CNT_ADDR in response to the third control signal CTL3 to output a changed refresh row address CREF_ADDR. When the changed refresh row address CREF_ADDR is output as a refresh row address REF_ADDR, two memory cell rows corresponding to two page addresses whose MSB are different from each other are simultaneously enabled. The two memory cell rows corresponding to two page addresses whose MSB are different from each other belong to different memory blocks in the memory cell array 300 which do not share a sense amplifier.

The refresh address output circuit 590 may include a first multiplexer 591 and a second multiplexer 593. The first multiplexer 591 may select one of the counting address CNT_ADDR and the weak page address WEAK_ADDR (WEAK_ADDR1~WEAK_ADDRK) in response to the first control signal CTL1. The second multiplexer 593 may select one of the changed refresh row address CREF_ADDR and an output of the first multiplexer 591 to output the refresh row address REF_ADDR in response to the second control signal CTL2.

Figure 7:
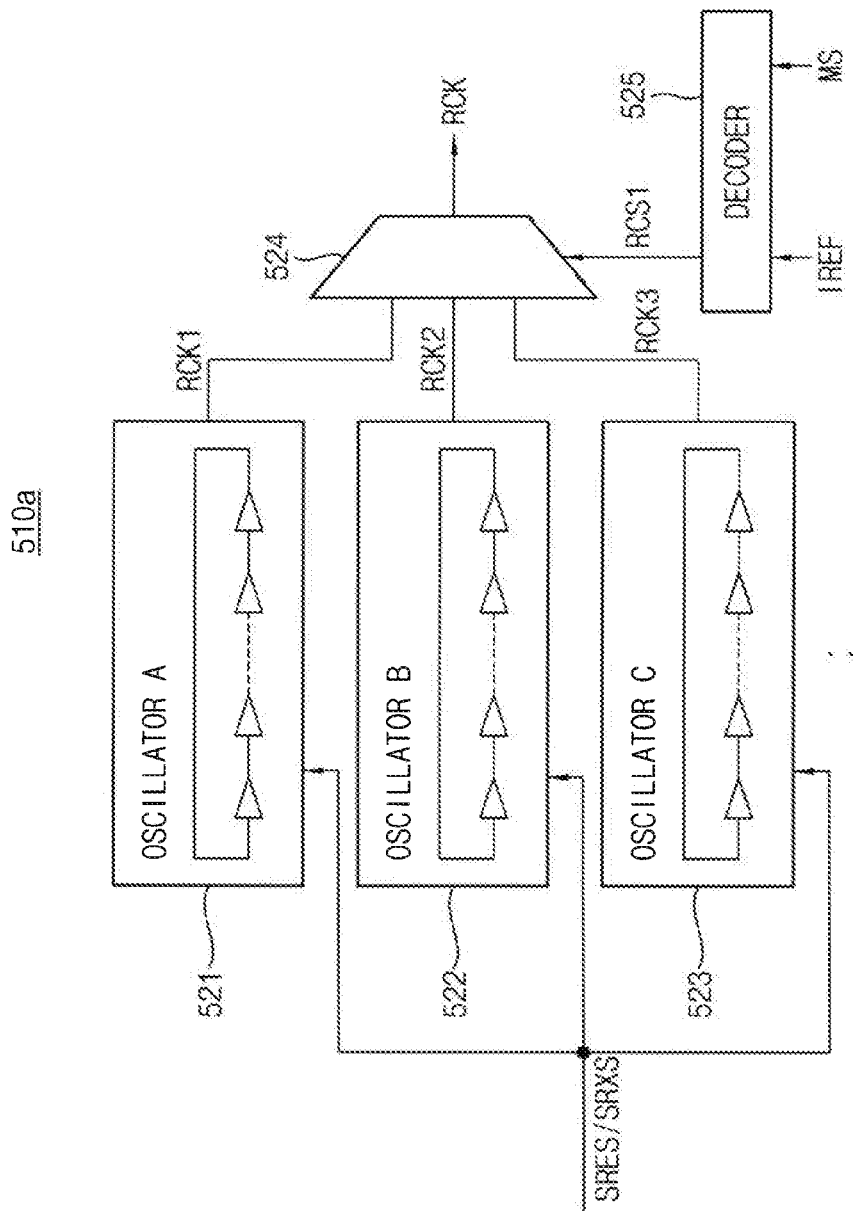
FIG. 7 is a circuit diagram illustrating an example of the refresh clock generator shown in FIG. 6 according to exemplary embodiments.

FIG. 7 is a circuit diagram illustrating an example of the refresh clock generator shown in FIG. 6 according to exemplary embodiments.

Referring to FIG. 7, a refresh clock generator 510*a* may include a plurality of oscillator 521, 522 and 523, a multiplexer 524 and a decoder 525. The decoder 525 may decodes the refresh control signal IREF and the mode signal MS to output a clock control signal RCS1. The oscillators 521, 522, 5*nd* 323 generate refresh clock signals RCK1, RCK2 and RCK3 having different periods. The multiplexer 524 selects one of the refresh clock signals RCK1, RCK2 and RCK3 to provide the refresh clock signal RCK in response to the clock control signal RCS1.

Figure 8:
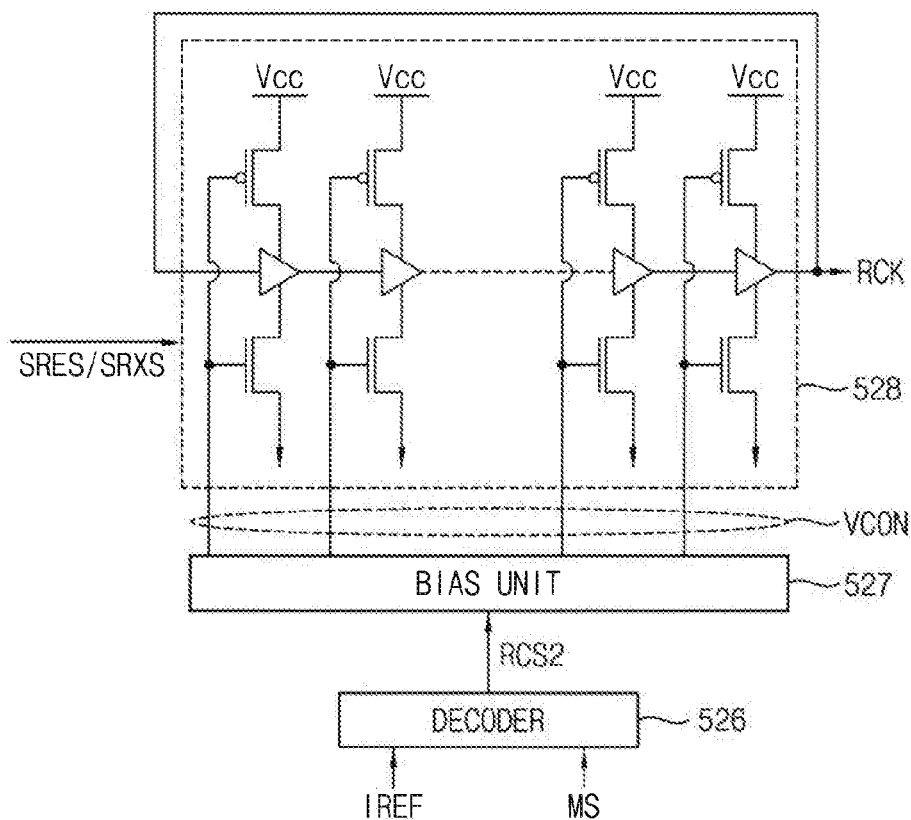
FIG. 8 is a circuit diagram illustrating another example of the refresh clock generator in FIG. 6 according to exemplary embodiments.

FIG. 8 is a circuit diagram illustrating another example of the refresh clock generator in FIG. 6 according to exemplary embodiments.

Referring to FIG. 6, a refresh clock generator 510*b* may include a decoder 526, a bias unit 527 and an oscillator 528. The decoder 526 may decode the refresh control signal IREF and the mode signal MS to output a clock control signal RCS2. The bias unit 527 generates a control voltage VCON in response to the clock control signal RCS2. The oscillator 528 generates the refresh clock signal RCK having a variable period, according to the control voltage VCON.

Figure 9:
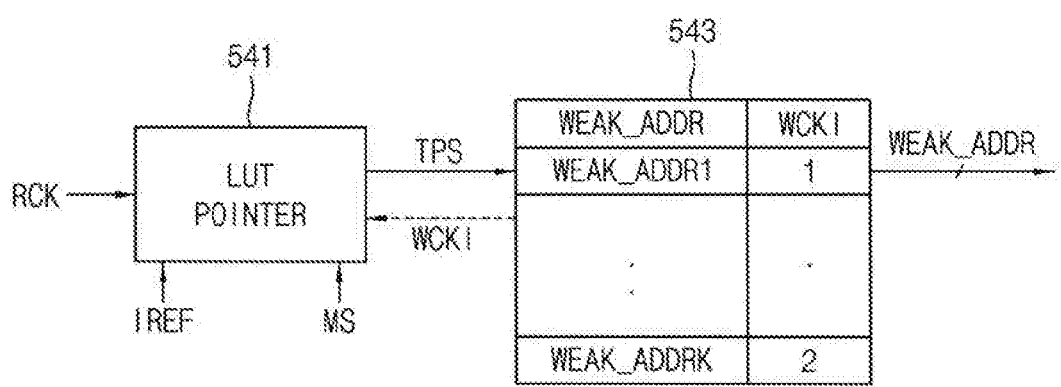
FIG. 9 illustrates the weak address generator in the refresh control circuit of FIG. 6 according to exemplary embodiments.

FIG. 9 illustrates the weak address generator in the refresh control circuit of FIG. 6 according to exemplary embodiments.

Referring to FIG. 9, the weak page address generator 540 may include a look-up table (LUT) pointer 541 and an LUT 543.

The LUT pointer 541 generates a table pointing signal TPS indicating gradually increasing table addresses of the LUT 543 in synchronization with the refresh clock signal RCK and delays providing the table pointing signal TPS to the LUT 543 by wait clocks indicated by the wait clock information WCKI. The LUT pointer 541 provides the table pointing signal TPS to the LUT 543. The LUT 543 may store the weak addresses WEAK_ADDR1~WEAK_ADDRK of the memory cell array 300 according to order as the addresses increase. The LUT 543 may store the wait clock information WCKI for designating output timing of the weak address WEAK_ADDR.

The LUT pointer 541 may delay providing the table pointing signal TPS to the LUT 543 by wait clocks indicated by the wait clock information WCKI or output the table pointing signal TPS to the LUT 543 in synchronization with the refresh clock signal RCK according to a refresh mode based on the refresh control signal REF land the mode signal MS.

For example, when the mode signal MS indicates the parallel refresh mode, the LUT pointer 541 may delay providing the table pointing signal TPS to the LUT 543 by wait clocks indicated by the wait clock information WCKI. For example, when the mode signal MS indicates the sequential refresh mode, the LUT pointer 541 may output the table pointing signal TPS to the LUT 543 in synchronization with the refresh clock signal RCK without regard to the wait clock information WCKI.

Figure 10:
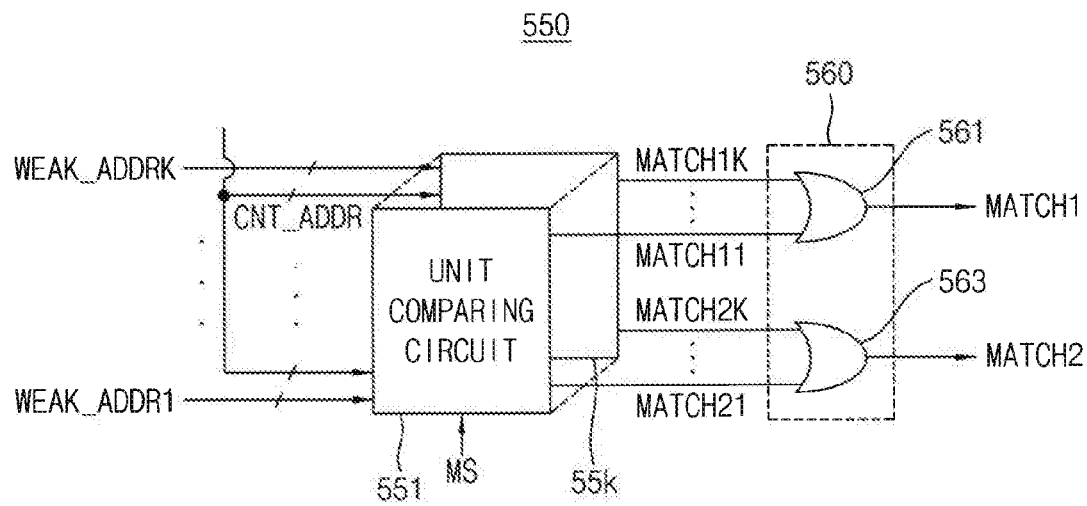
FIG. 10 illustrates the address comparing circuit shown in the refresh control circuit of FIG. 6 according to exemplary embodiments.

FIG. 10 illustrates the address comparing circuit shown in the refresh control circuit of FIG. 6 according to exemplary embodiments.

Referring to FIG. 10, the address comparing circuit 550 may include a plurality of unit comparing circuit 551-55K and an operation unit 560.

Each of the unit comparing circuits 551-55K may compare each of the weak page addresses WEAK_ADDR1~WEAK_ADDRK and the counting address CNT_ADDR to provide a plurality of first match signals MATCH11~MATCH1K and compare each of abbreviated weak page addresses and an abbreviated counting address to provide a plurality of second match signals MATCH21~MATCH2K. Each of the abbreviated weak page addresses may be obtained by omitting at least one bit such as an MSB of each of the weak page addresses WEAK_ADDR1~WEAK_ADDRK and the abbreviated counting address may be obtained by omitting an MSB of the counting address CNT_ADDR.

The operation unit 560 provides the first match signal MATCH1 and the second match signal MATCH2 based on the first match signals MATCH11~MATCH1K and the second match signals MATCH21~MATCH2K respectively. The operation unit 560 may include OR gates 561 and 563. The OR gates 561 performs logical OR operation on the first match signals MATCH11~MATCH1K to provide the first match signal MATCH1 and the OR gate 563 performs logical OR operation on the second intermediate match signals MATCH21~MATCH2K to provide the second match signal MATCH2.

Therefore, when at least one of the weak page addresses WEAK_ADDR1~WEAK_ADDRK matches with the counting address CNT_ADDR, the first match signal MATCH1 is a first logic level. In addition, when at least one of the abbreviated weak page addresses matches with the abbreviated counting address, the second match signal MATCH2 is a first logic level. That is, when at least one of the weak page addresses WEAK_ADDR1~WEAK_ADDRK with matches with the counting address CNT_ADDR in every bit, the first and second match signals MATCH1 and MATCH2 are first logic level. When each address bit of at least one of the weak page addresses WEAK_ADDR1~WEAK_ADDRK matches with each address bit of the counting address CNT_ADDR except at least one bit such as most significant bit MSB, the first match signal MATCH1 is a second logic level and the second match signal MATCH2 is a first logic level.

Figure 11:
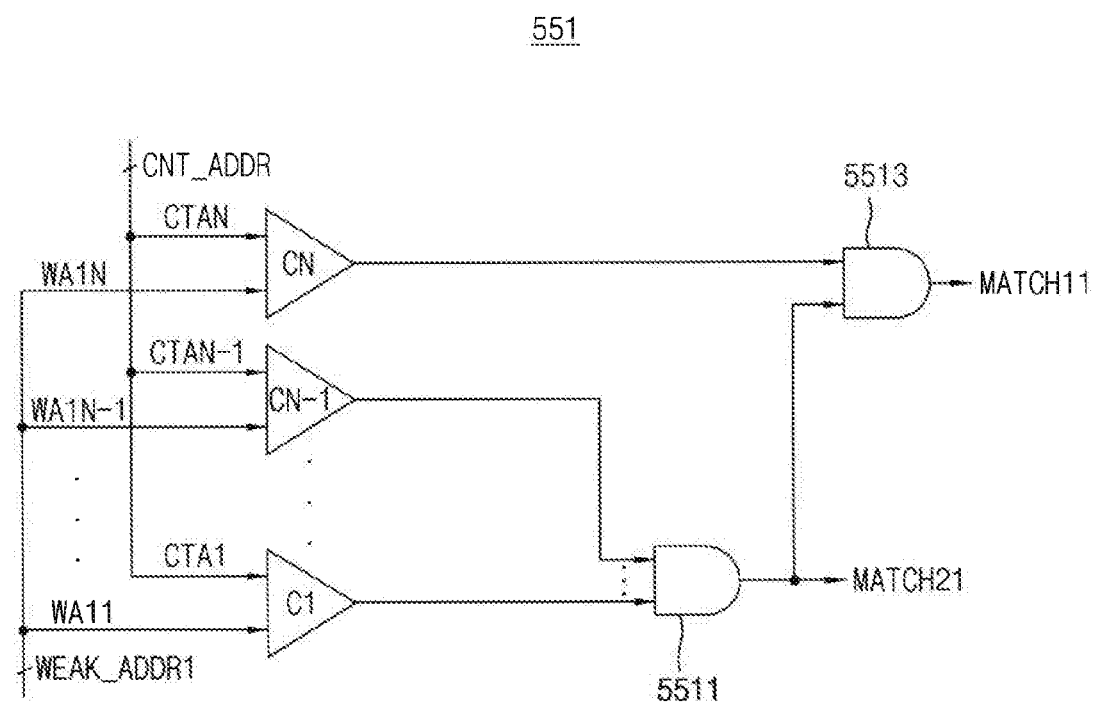
FIG. 11 illustrates one of the unit comparing circuit shown in FIG. 10.

FIG. 11 illustrates one of the unit comparing circuit shown in FIG. 10.

In FIG. 11, a configuration of the first unit comparing circuit 551 of the unit comparing circuit 551-55K in FIG. 10 is illustrated.

Referring to FIG. 11, the first unit comparing circuit 551 may include a plurality of comparators C1~CN and AND gates 5511 and 5513. The comparators C1~CN compare bits WA11~WA1N of the first weak page address WEAK_ADDR1 and bits CTA1~CTAN of the counting address CNT_ADDR respectively. The AND gate 5511 performs logical AND operation on outputs of the comparators C1~CN–1 except output of the comparator CN that compares MSBs of the weak page address WEAK_ADDR1 and the counting address CNT_ADDR to provide the second match signal MATCH21. The AND gate 5513 performs logical AND operation on outputs of the AND gate 5511 and the comparator CN to provide the first match signal MATCH11.

Therefore, the first match signal MATCH11 is a first logic high level when each bit WA11~WA1N of the first weak page address WEAK_ADDR1 matches with corresponding bit CTA1~CTAN of the counting address CNT_ADDR. In addition, the second match signal MATCH21 is a first level when each bit WA11~WA1N–1 of the first weak page address WEAK_ADDR1 except MSB matches with corresponding bit CTA1~CTAN–1 of the counting address CNT_ADDR except MSB. That is, when the first match signal MATCH11 is a second logic level and the second match signal MATCH21 is a first logic level, the MSB of the counting address CNT_ADDR is different from the MSB of the first weak page address WEAK_ADDR1.

Figure 12:
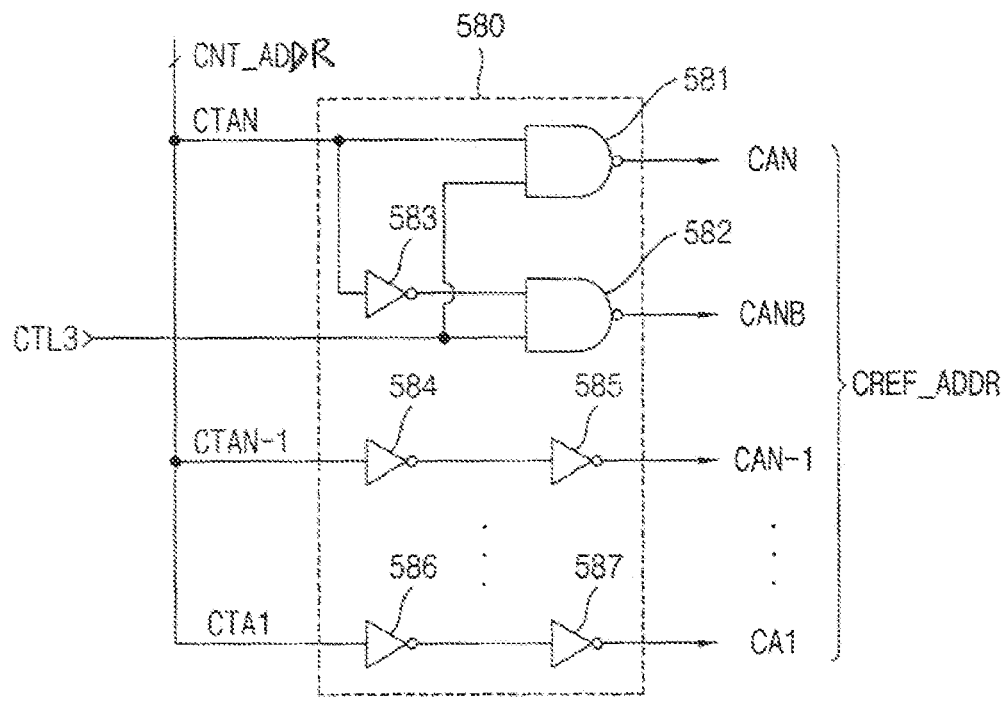
FIG. 12 illustrates the address converter in the refresh control circuit of FIG. 6 according to exemplary embodiments.

FIG. 12 illustrates the address converter in the refresh control circuit of FIG. 6 according to exemplary embodiments.

Referring to FIG. 12, the address converter 580 may include NAND gates 581 and 582, an inverter 5383, inverters 584 and 585 and inverters 586 and 587. The NAND gate 581 performs a logical NAND operation on MSB CTAN of the counting address CNT_ADDR and the third control signal CTL3 to output an MSB CAN of the changed refresh row address CREF_ADDR.

The inverter 583 inverts the MSB CTAN of the counting address CNT_ADDR, and the NAND gate 582 performs a logical NAND operation on an output of the inverter 583 and the third control signal CTL3 to output an inverted version CANB of the MSB CAN of the changed refresh row address CREF_ADDR. The inverters 584 and 585 buffer a bit CTAN–1 of the counting address CNT_ADDR to output a bit CAN–1 of the changed refresh row address CREF_ADDR. The inverters 586 and 587 buffer a first bit CTA1 of the counting address CNT_ADDR to output a first bit CA1 of the changed refresh row address CREF_ADDR.

When the third control signal CTL3 has a second logic level, the NAND gates 581 and 582 may provide complementary outputs CAN and CANB having same logic levels without regard to a logic level of the MSB CTAN of the counting address CNT_ADDR. That is, when the MSB of the counting address CNT_ADDR CTAN is do-not-care processed, two memory cell rows may be selected from bits of the changed refresh row address CREF_ADDR except the MSB of the changed refresh row address CREF_ADDR. Therefore, when third control signal CTL3 has a second logic level, two memory cell rows may be simultaneously refreshed by one refresh row address REF_ADDR.

Figure 13:
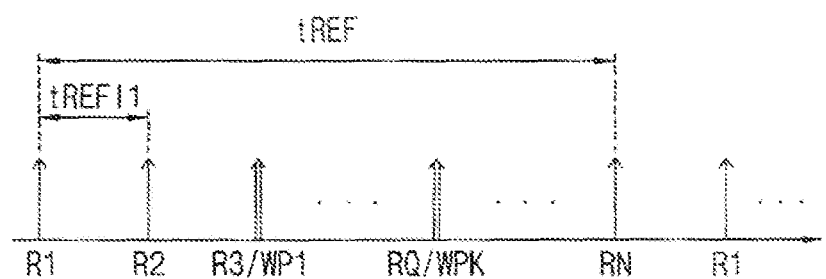
FIG. 13 illustrates that the normal self-refresh operation and the weak self-refresh operation are performed in parallel in the semiconductor memory device of FIG. 3.

FIG. 13 illustrates that the normal self-refresh operation and the weak self-refresh operation are performed in parallel in the semiconductor memory device of FIG. 3.

Referring to FIG. 13, when the semiconductor memory device 200 receives the self-refresh entry command SRE from the memory controller 100, the weak self-refresh operation on the weak pages is performed in parallel with the normal refresh operation during the refresh period tREF. Memory cell rows corresponding to row addresses R1~RN are sequentially refreshed. In this example, different groups of memory cell rows (such as M memory cell rows) may respectively correspond to each of the row addresses R1~RN illustrated in FIGS. 13 and 14. For example, a self refresh operation of plural memory cell rows may be represented by each of R1~RN illustrated in FIGS. 13 and 14 and each of these self refresh operations may correspond to FIG. 4B and its description (including being initiated and performed in response to a pair of SRE/SRX commands separated by a fixed interval as described herein). The row addresses R1~RN are generated by the refresh address counter. When one or more memory cell rows corresponding to the row address R3 are refreshed, a weak page corresponding to a weak page address WP1 different from the row address R3 in the MSB is simultaneously refreshed.

In addition, when one or more memory cell rows corresponding to the row address RQ (Q is a natural number greater than 3 and smaller than N) are refreshed, a weak page corresponding to a weak page address WPK different from the row address RQ in the MSB is simultaneously refreshed. In FIG. 13, the groups of memory cell rows corresponding to the row addresses R1~RN may be sequentially refreshed according to a first refresh interval tREFI1 within the refresh period tREF. For example, a pair of SRE/SRX commands may be received for each of R1~RN every tREFI1 to provide a series of N spaced apart self refresh mode refresh operations during the refresh period tREF at each of R1~RN, with normal access operations being allowed and/or occurring between these N self refresh mode operations. A group of memory cell rows may be refreshed by self refresh during each of these N spaced apart self refresh modes (such as a group of M memory cell rows, as described herein, with minimal delay between each subsequent refresh operation of the M rows).

In example embodiments, the memory controller 100 may sequentially transmit only one self-refresh entry command and one self-refresh exit command by a particular interval shorter than the refresh period tREF. For example, in response to the self-refresh entry command, all of the memory cell rows of the memory cell array 300 corresponding to the row addresses R1~RN may be refreshed according to a particular refresh period shorter than the first refresh interval tREFI1 within the refresh period tREF. In this case, the memory controller 100 may transmit the self-refresh exit command to the semiconductor memory device 200 earlier than the case of FIG. 13.

In other example embodiments, the memory controller 100 may sequentially transmit M self-refresh entry commands and M self-refresh exit commands by M−1 intervals during the refresh period tREF. In response to the M self-refresh entry commands, all of the memory cell rows of the memory cell array 300 corresponding to the row addresses R1~RN are refreshed according to a second refresh interval within the refresh period tREF.

Figure 14:
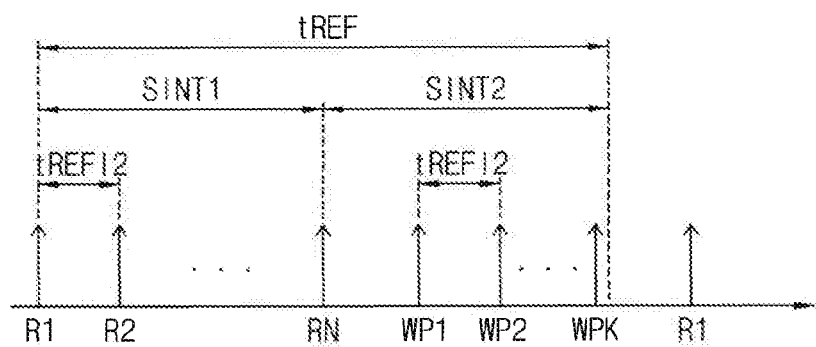
FIG. 14 illustrates that the normal self-refresh operation and the weak self-refresh operation are sequentially performed in the semiconductor memory device of FIG. 3.

FIG. 14 illustrates that the normal self-refresh operation and the weak self-refresh operation are sequentially performed in the semiconductor memory device of FIG. 3.

Referring to FIG. 14, when the semiconductor memory device 200 receives the self-refresh entry command SRE from the memory controller 100, the weak self-refresh operation on the weak pages is performed after the normal self-refresh operation. Memory cell rows corresponding to row addresses R1~RN are sequentially refreshed according to a second refresh interval tREFI2 during a first sub interval SINT1 within the refresh period tREF and the weak pages WP1~WPK are sequentially refreshed according to the second refresh interval tREFI2 during a second sub interval SINT2 within the refresh period tREF. In the case of FIG. 14, the refresh clock generator 510 may decrease the period of the refresh clock signal RCK, for example, by a half when compared with the case of FIG. 13.

Figure 15:
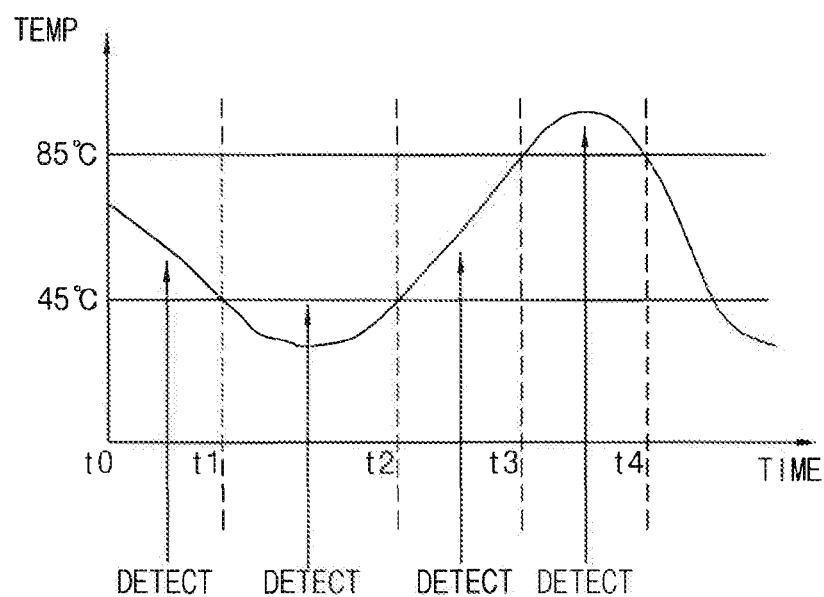
FIG. 15 is a graph illustrating a sensing operation of the temperature sensor in FIG. 3.

FIG. 15 is a graph illustrating a sensing operation of the temperature sensor in FIG. 3 and FIG. 16 is a table illustrating code signals in sensed temperature intervals according to exemplary embodiments.

Operations of the temperature sensor 280 (see FIG. 3) will be described in detail with reference to FIGS. 15 and 16.

An X-axis of FIG. 15 denotes time and a Y-axis of FIG. 15 denotes temperature.

For example, when a temperature interval in a range of 45 Celsius degree to 85 Celsius degree is denoted as a room temperature, a temperature of 45° C. or less is denoted as a low temperature, and a temperature of 85° C. or more is denoted as a high temperature.

Referring to FIG. 15, since the temperature is between 45° C. and 85° C. in a time interval t0 to t1, the temperature is detected as the room temperature. Since the temperature is 45° C. or less in a time interval t1 to t2, the temperature is detected as the low temperature. Since the temperature is between 45° C. and 85° C. in a time interval t2 to t3, the temperature is detected as the room temperature. Since the temperature is 85° C. or more in a time interval t3 to t4, the temperature is detected as the high temperature.

With reference to the table in FIG. 16, the temperature sensor 280 (see FIG. 3) provides the temperature signal TS indicating that the time interval t0 to t1 is the room temperature interval and the code signal generator 170 provides a second code signal MR2 corresponding to '010'. Further, since the time interval t1 to t2 is the low temperature interval, the code signal generator 170 provides a first code signal MR1 corresponding to '001'. Since the time interval t2 to t3 is the room temperature interval, the code signal generator 170 provides the second code signal MR2 corresponding to '010'. Since the time interval t3 to t4 is the high temperature interval, the code signal generator 170 provides a third code signal MR3 corresponding to '011'.

FIG. 17 is a table illustrating a selection of the refresh period mode according to the code signal of the refresh clock generator in FIG. 6 according to exemplary embodiments.

Referring to FIG. 17, it is noted that different refresh intervals may be selected according to the refresh control signal IREF that reflects the code signal MR.

Figure 18:
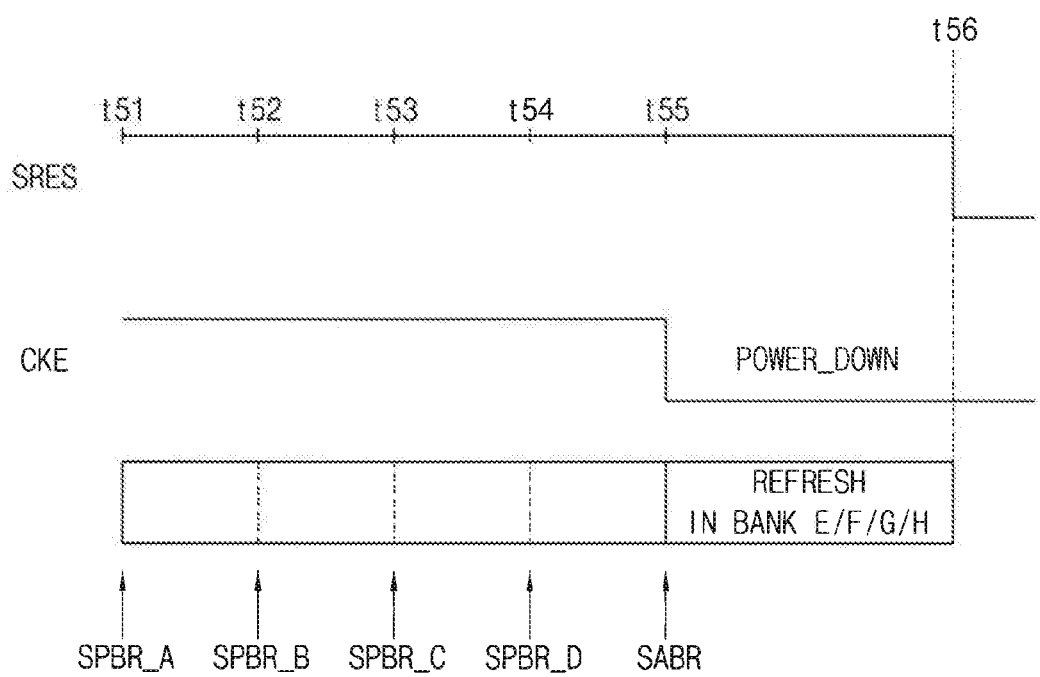
FIGS. 18 and 19 illustrate that that a refresh operation is performed in the memory system of FIG. 2.
Figure 19:
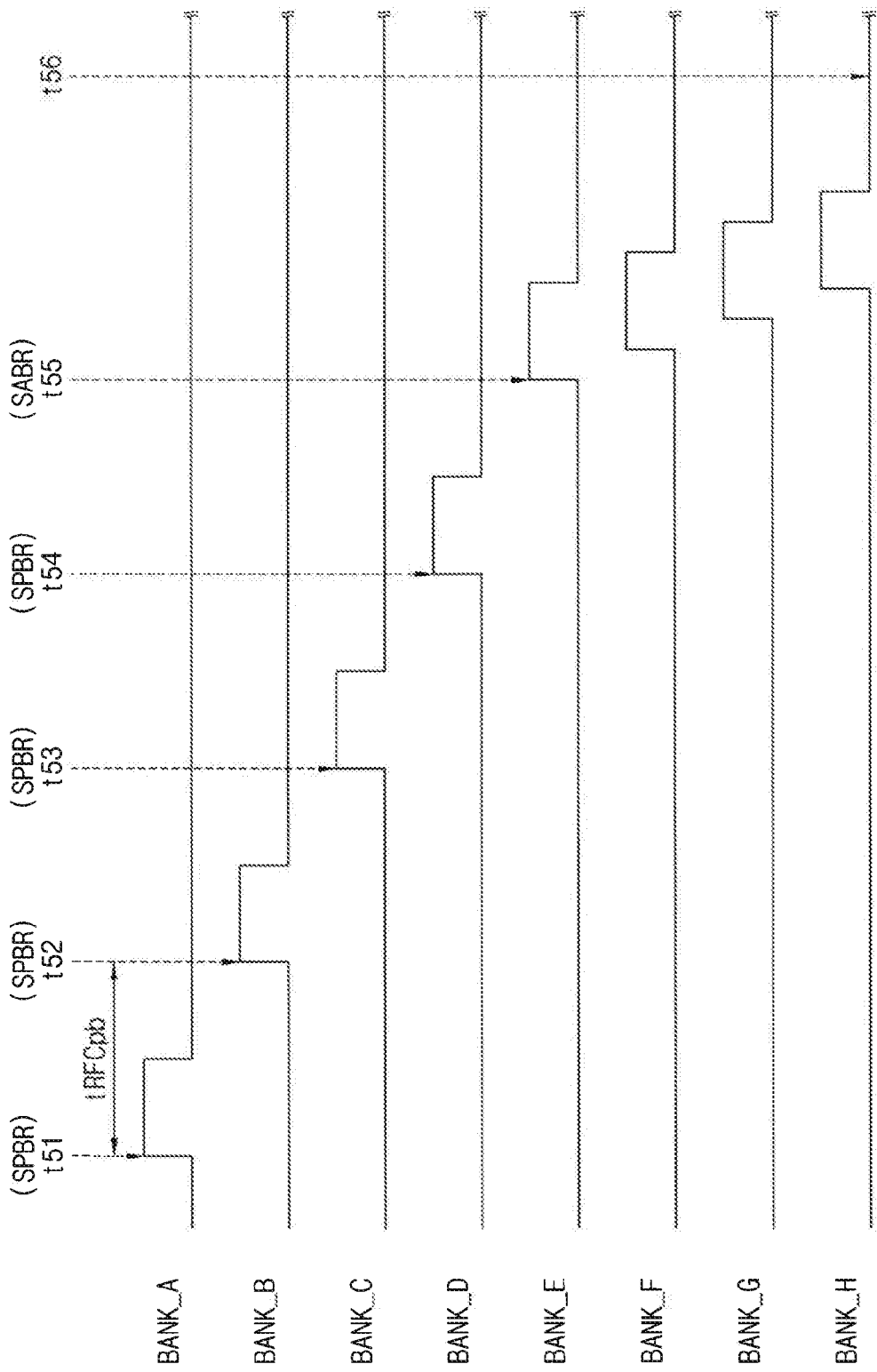

FIGS. 18 and 19 illustrate that that a refresh operation is performed in the memory system of FIG. 1.

Referring to FIGS. 1, 3 and 18, between time points t51~t55 during each of the internal self-refresh entry signal SRES and the clock enable signal CKE is at a high level, the semiconductor memory device 200 operates in the self-refresh mode and the semiconductor memory device 200 may enter into a power down mode between time points t55~t56 during the clock enable signal CKE is at a low level.

During the time points t51~t52, a refresh operation is performed in memory cell rows in a first bank array BANK_A in response to a per-bank self-refresh command SPBR_A from the memory controller 100, a refresh operation is performed in memory cell rows in a second bank array BANK_B in response to a per-bank self-refresh command SPBR_B during the time points t52~t53, a refresh operation is performed in memory cell rows in a third bank array BANK_C in response to a per-bank self-refresh command SPBR_C during the time points t53~t54, and a refresh operation is performed in memory cell rows in a fourth bank array BANK_D in response to a per-bank self-refresh command SPBR_D during the time points t54~t55.

When the memory controller 100 applies the per-bank self-refresh command SPBR to the semiconductor memory device 200, the memory controller 100 also provides the semiconductor memory device 200 with information on a bank array to be refreshed. When the memory system 10 performs the per-bank refresh operation, the memory controller 100 executes the per-bank self-refresh command SPBR on each of the bank arrays BANK_A~BANK_H, and then the memory system 10 enter into the power down mode. In this case, power consumption of the semiconductor memory device 200 may be increased.

In some examples, with the self-refresh entry command, the memory controller 100 may transmit the all-bank self-refresh command SABR or the per-bank self-refresh command SPBR to the semiconductor memory device 200. For example, each of the all-bank self-refresh command SABR and the per-bank self-refresh command SPBR may be generated by decoding the write enable signal WEB, the row address strobe signal RASB, the column address strobe signal CASB, the chip selection signal CSB, the clock enable signal CKE, address signal, etc.

While the per-bank self-refresh operation is sequentially performed on the bank arrays BANK_A~BANK_H by the memory controller 100, if the memory controller 100 does not receive an access request other than a request of the per-bank refresh operation (that is, there is no other access requests than the request to direct the per-bank self-refresh operation in the command queue 143 of the scheduler 140) before the per-bank self-refresh operation is completed on all of the bank arrays BANK_A~BANK_H as at the time point t55, the memory controller 100 refreshes some bank arrays BANK E~BANK_H of the bank arrays BANK_A-~BANK_H, which are not refreshed by the per-bank self-refresh operation by issuing one all-bank self-refresh command SABR, by the command generator 130, to the semiconductor memory device 200. The some bank arrays BANK E~BANK_H may be refreshed between the time points t55~t56 in response to the all-bank self-refresh command SABR. When a refresh operation of the some bank arrays BANK E~BANK_H is completed at a particular time point between the time points t55~t56, the semiconductor memory device 200 may enter into a power down mode at the particular time point. Therefore, the memory system 10 may reduce refresh current because a time required for entering into the power down mode may be less than a time required for sequentially performing the per-bank self-refresh operation on the bank arrays BANK_A~BANK_H.

In general, when the memory controller 100 issues the all bank refresh command, the semiconductor memory device 200 internally performs the refresh operation on the bank arrays BANK_A~BANK_H to complete one refresh operation. However, according to present disclosure, while the per-bank self-refresh operation is performed, the semiconductor memory device 200 may enter into the power-down mode after performing the refresh operation of the some bank arrays that are not refreshed in the per-bank self-refresh operation, in response to the all-bank self-refresh command. Therefore, power consumption may be reduced.

Figure 20:
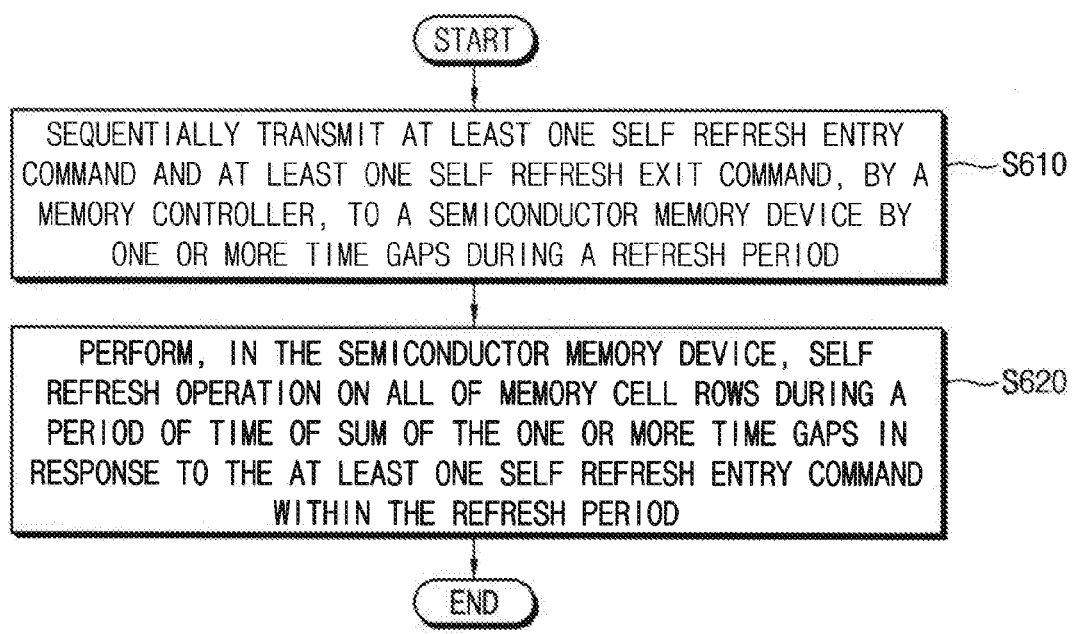
FIG. 20 is a flow chart illustrating a method of operating a semiconductor memory device according to exemplary embodiments.

FIG. 20 is a flow chart illustrating a method of operating a memory system according to exemplary embodiments.

Referring to FIGS. 1 to 20, in a method of operating a memory system including a semiconductor memory device having a memory cell array 300 that includes a plurality of memory cell rows, and each of which includes dynamic memory cells, the memory controller 100 sequentially transmits at least one self-refresh entry command SRE and at least one self-refresh exit command SRX to the semiconductor memory device 200, separated by one or more first time gaps during a refresh period (S610).

A refresh control circuit 400 of the semiconductor memory device 200 performs a self-refresh operation on all of the memory cell rows during a first period of time equal to the sum of the one or more time gaps in a self-refresh mode in response to the at least one self-refresh entry command SRE, within the refresh period (S620).

Figure 21:
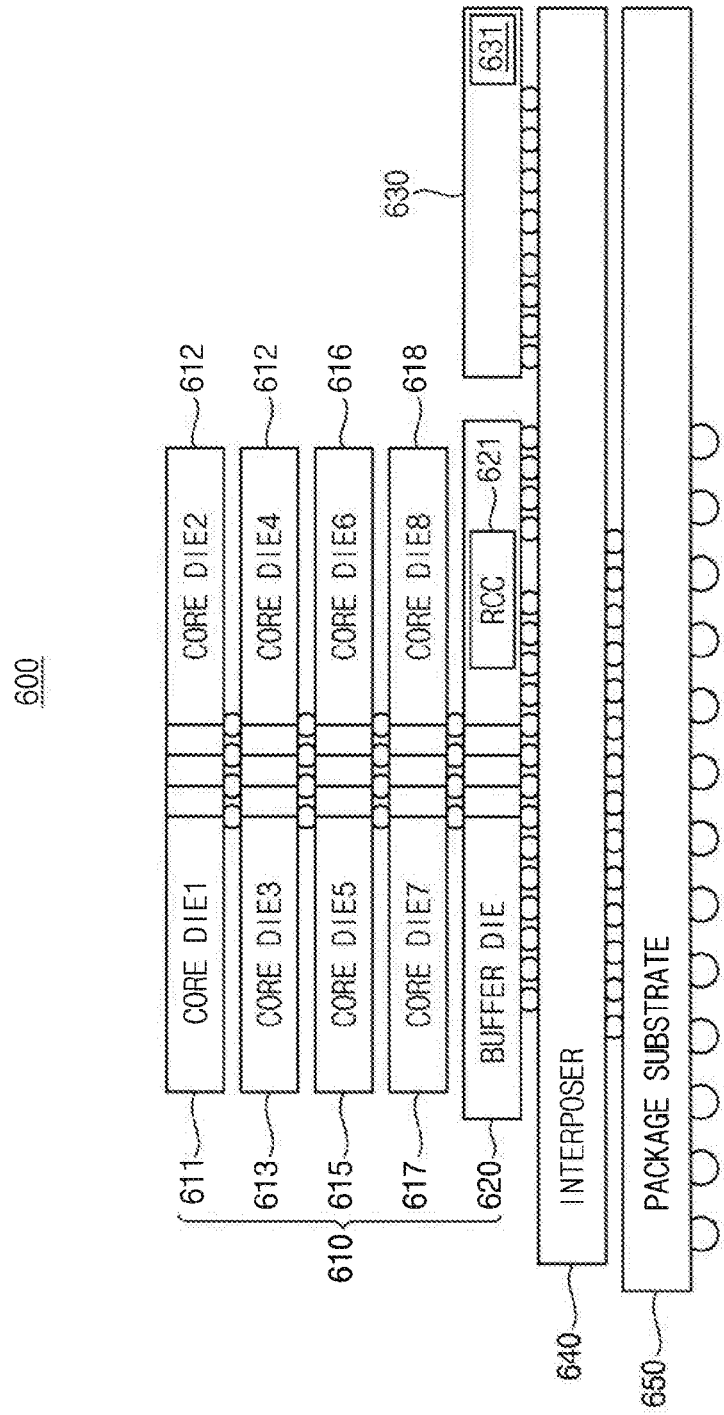
FIG. 21 is a cross-sectional view of a 3D chip structure employing a semiconductor memory device according to exemplary embodiments.

FIG. 21 is a cross-sectional view of a 3D chip structure employing a semiconductor memory device according to exemplary embodiments.

Referring to 21, a memory system 600 may include a semiconductor memory device 610, a system-on-chip (SoC) 630, an interposer 640 and a package substrate 650.

The memory system 600 may be a high-bandwidth memory (HBM) device and may include a buffer die 620 and first through eighth core dies 611~618. The buffer die 620 and the first through eighth core dies 611~618 may be connected to each other by through silicon vias. The first through eighth core dies 611~618 may employ the memory cell array 300 in FIG. 3.

The buffer die 620 may include a refresh control circuit 621 and the refresh control circuit 621 may perform a self-refresh operation on all of memory cell rows in the memory cell array in the core dies 611~618 in response to a self-refresh entry command during a first interval between the self-refresh entry command and self-refresh exit command. The refresh control circuit 621 may employ the refresh control circuit of FIG. 5 or the refresh control circuit of FIG. 6. Therefore, the refresh control circuit 621 may perform a refresh operation on the memory cell rows without auto refresh commands, and thus may reduce current consumption.

The SoC 630 may include a memory controller 631. The memory controller 631 may employ the memory controller 100 of FIG. 1 or FIG. 2. The interposer 640 may connect the SoC 630 with the buffer die 620 through wires. The package substrate 650 may support the SoC 630 and the semiconductor memory device 610 and may connect the SoC 630 and the semiconductor memory device 610 to a mother board (not shown).

Figure 22:
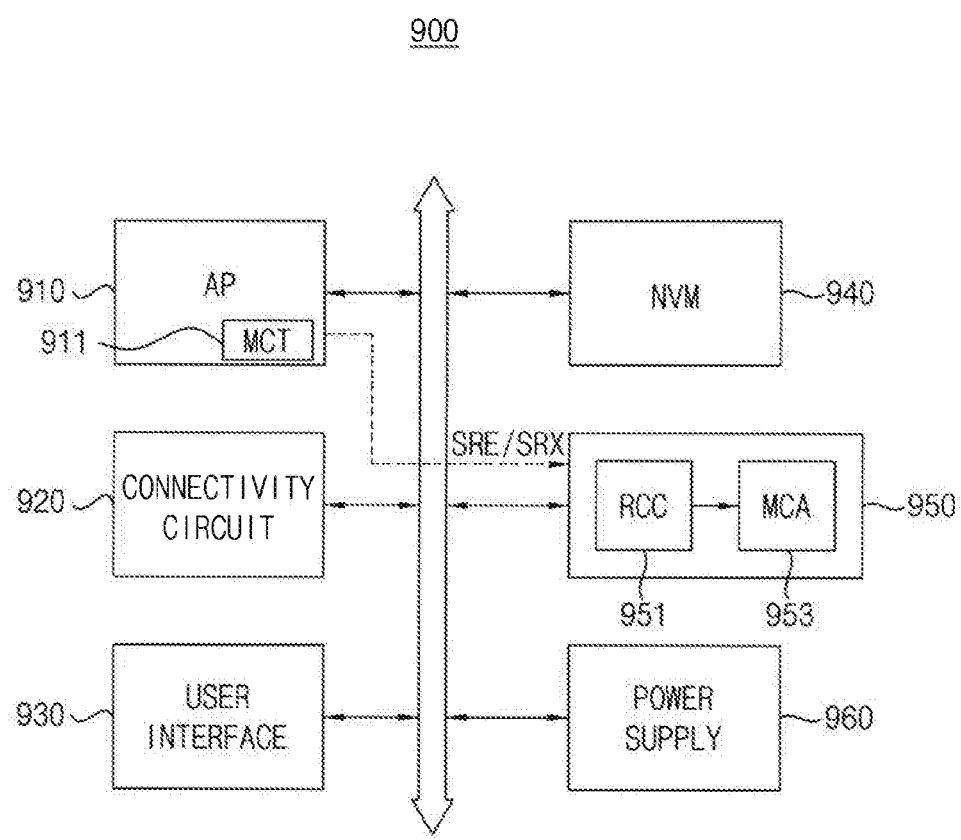
FIG. 22 is a block diagram illustrating a mobile system including the semiconductor memory device according to exemplary embodiments.

FIG. 22 is a block diagram illustrating a mobile system including the semiconductor memory device according to exemplary embodiments.

Referring to FIG. 22, a mobile system 900 may include an application processor 910, a connectivity circuit 920, a semiconductor memory device 950, a nonvolatile memory device 940, a user interface 930 and a power supply 960.

The application processor 910 may execute applications, such as a web browser, a game application, a video player, etc. In some embodiments, the application processor 910 may include a single core or multiple cores. For example, the application processor 910 may be a multi-core processor, such as a dual-core processor, a quad-core processor, a hexa-core processor, etc. The application processor 910 includes a memory controller 911.

The connectivity circuit 920 may perform wired or wireless communication with an external device. The semiconductor memory device 950 may store data processed by the application processor 910 or operate as a working memory. The memory controller 911 may transmit a self-refresh entry command SRE and a self-refresh exit command SRX to the semiconductor memory device 950 as disclosed above.

The semiconductor memory device 950 may include a refresh control circuit 951 and a memory cell array 953. The refresh control circuit 951 may employ the refresh control circuit 400 of FIG. 3, the refresh control circuit 400a of FIG. 5, or the refresh control circuit 400b of FIG. 6.

The nonvolatile memory device 940 may store a boot image for booting the mobile system 900.

The user interface 930 may include at least one input device, such as a keypad, a touch screen, etc., and at least one output device, such as a speaker, a display device, etc. The power supply 960 may supply a power supply voltage to the mobile system 900.

In some embodiments, the mobile system 900 and/or components of the mobile system 900 may be packaged in various forms.

The present disclosure may be applied to systems using memory controllers and semiconductor memory devices to reduce current consumption.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present disclosure. Accordingly, all such modifications are intended to be included within the scope of the present disclosure as defined in the claims.

What is claimed is:

1. A memory system comprising:
  a memory controller configured to transmit one or more command pairs of a self-refresh entry command and a subsequent self-refresh exit command to a semiconductor memory device during a refresh period,
  wherein the semiconductor memory device comprises:
  a memory cell array including a plurality of memory cell rows each including a plurality of dynamic memory cells; and
  a refresh control circuit configured to perform a refresh operation on all of the memory cell rows of the memory cell array during the refresh period in a self-refresh mode, the self-refresh mode of the refresh period being configured in response to each self-refresh entry command of the one or more command pairs,
  wherein, for each of the one or more command pairs, the memory controller is configured to sequentially transmit during the refresh period at least one self-refresh entry command and at least one self-refresh exit command to the semiconductor memory device separated by one or more time gaps, wherein a first period of time equal to the sum of the one or more time gaps is predetermined, wherein the memory cell array includes a plurality of bank arrays each including a plurality of dynamic memory cells, and wherein the refresh control circuit is configured to perform the refresh operation simultaneously on ail of the bank arrays when the self-refresh entry command corresponds to an all-bank refresh command designating the refresh operation on all of the bank arrays.

2. The memory system of claim 1, wherein the semiconductor memory device is configured to receive and execute access commands not related to the refresh operation of the semiconductor memory device during the refresh period outside of the self-refresh mode.

3. The memory system of claim 1, wherein the refresh control circuit includes:
an oscillator configured to generate an oscillation signal, to be enabled in response to a self-refresh entry signal corresponding to the self-refresh entry command, and to be disabled in response to a self-refresh exit signal corresponding to the self-refresh exit command;
a refresh clock generator configured to generate a refresh clock signal toggling with a period of a refresh interval of the semiconductor memory device, in response to the oscillation signal; and
a refresh address counter configured to generate a refresh row address designating a memory cell row to be refreshed by performing a counting operation in response to the refresh clock signal.

4. The memory system of claim 3, wherein the semiconductor memory device further includes:
a control logic circuit including a mode register configured to receive a code signal from the memory controller, and configured to generate a refresh control signal based on the code signal,
wherein the memory controller is configured to provide the code signal based on a temperature signal which is generated by sensing change of an operating temperature of the semiconductor memory device,
wherein the refresh control circuit is configured to change a refresh interval of the semiconductor memory device in response to the refresh control signal which is generated based on the code signal.

5. The memory system of claim 4, wherein the refresh control circuit is configured to decrease the refresh interval according to increasing the operating temperature.

6. The memory system of claim 1, wherein the refresh control circuit is configured to perform the refresh operation on one or more weak pages of the plurality of memory cell rows at least two times during the refresh period, each of the weak pages including at least one weak cell whose data retention time is smaller than a normal cell.

7. The memory system of claim 6, wherein the refresh control circuit is configured to perform a weak self-refresh operation on the one or more weak pages in parallel with a normal self-refresh operation on the memory cell rows cell rows during the refresh period.

8. The memory system of claim 7, wherein while the refresh control circuit performs the normal self-refresh operation on the memory cell rows during the refresh period, the refresh control circuit simultaneously refreshes a corresponding weak page when the refresh control circuit refreshes a first memory cell row of the memory cell rows, the first memory cell row having a first page address which is the same as one of weak page addresses of the weak pages except that the first page address differs from the one of the weak page addresses by at least one bit.

9. The memory system of claim 6, wherein when the refresh control circuit performs a normal self-refresh operation on the memory cell rows during the refresh period, the refresh control circuit performs a weak self-refresh operation on the one or more weak pages after the normal self-refresh operation on the memory cell rows is completed.

10. The memory system of claim 9, wherein the refresh control circuit is configured to decrease a refresh interval of the semiconductor memory device, configured to perform the normal self-refresh operation during a first sub interval of the refresh period and configured to perform the weak self-refresh operation during a second sub interval of the refresh period, the second sub interval succeeding to the first sub interval.

11. The memory system of claim 1, wherein the refresh control circuit includes:
a refresh clock generator including an oscillator configured to be enabled in response to a self-refresh entry signal corresponding to the self-refresh entry command, to generate a refresh clock signal in response to a refresh control signal and a mode signal, and configured to be disabled in in response to a self-refresh exit signal corresponding to the self-refresh exit command;
a refresh address counter configured to generate counting address for sequentially refreshing the memory cell rows in response to the refresh clock signal, the refresh address counter outputting a done signal upon generating a maximum counting address;
a weak page address generator configured to store a weak page address of a weak page, and output the weak page address in response to the refresh clock signal;
an address comparing circuit configured to compare the counting address with the weak page address to output a first match signal and a second match signal;
a control signal generator configured to generate a plurality of control signals based on the refresh control signal, the mode signal, the done signal, the first match signal and the second match signal;
an address converter configured to generate a changed refresh row address by do-not-care processing at least one bit of the counting address, in response to a third control signal of the plurality of the control signals; and
a refresh address output circuit configured to output one of the counting address, the weak page address and the changed refresh row address as a refresh row address according to a refresh mode, based on a first control signal and a second control signal of the plurality of the control signals.

12. The memory system of claim 11, wherein the refresh address output circuit comprises:
a first multiplexer configured to select one of the counting address and the weak page address in response to the first control signal; and
a second multiplexer configured to select one of the changed refresh row address and an output of the first multiplexer to output the refresh row address in response to the second control signal.

13. The memory system of claim 1, wherein
the semiconductor memory device enters into a power-down mode when the refresh operation on all of the bank arrays is completed.

14. The memory system of claim 1, wherein the semiconductor memory device further comprises:

at least one buffer die; and a plurality of memory dies stacked on the at least one buffer die and conveying data through a plurality of through silicon via (TSV) lines, wherein each of the plurality of memory dies includes the memory cell array, and wherein the at least one buffer die includes the refresh control circuit.

15. A memory system comprising:

at least one semiconductor memory device; and a memory controller configured to transmit one or more command pairs of a self-refresh entry command and a subsequent self-refresh exit command to the at least one semiconductor memory device during a refresh period, wherein the at least one semiconductor memory device includes:

a memory cell array including a plurality of bank arrays each including a plurality of memory cell rows each including a plurality of dynamic memory cells; and a refresh control circuit configured to perform a refresh operation on all of the memory cell rows during the refresh period in a self-refresh mode, the self-refresh mode of the refresh period being configured in response to each self-refresh entry command of the one or more command pairs, wherein, for each of the one or more command pairs, the memory controller is configured to sequentially transmit during the refresh period at least one self-refresh entry command and at least one self-refresh exit command to the semiconductor memory device separated by one or more time gaps, wherein when the memory controller transmits an all-bank self-refresh command with the self-refresh entry command to the semiconductor memory device, the refresh control circuit performs the refresh operation on all of the bank arrays, wherein when the memory controller transmits a per-bank self-refresh command with the self-refresh entry command to the semiconductor memory device in the self-refresh mode, the refresh control circuit performs the refresh operation on each of the bank arrays, and wherein the refresh control circuit is configured to perform the refresh operation simultaneously on all of the bank arrays when the self-refresh entry command corresponds to the all-bank self-refresh command designating the refresh operation on all of the bank arrays.

16. The memory system of claim 15, wherein the memory controller comprises:

a command generator configured to generate the at least one self-refresh entry command and the at least one self-refresh exit command sequentially by the one or more time gaps;

a timer configured to receive the self-refresh entry command and provide a timing signal to the command generator when each of one or more time gaps is elapsed from receiving the self-refresh entry command;

a scheduler configured to schedule commands from the command generator, the commands including the at least one self-refresh entry command and the at least one self-refresh exit command; and a control circuit configured to control the timer, the command generator and the scheduler, wherein the scheduler is configured to schedule the commands such that valid commands are not inserted between a self-refresh entry command and a subsequent self-refresh exit command.

17. The memory system of claim 15, wherein the memory controller further includes:

a temperature sensor configured to provide the semiconductor memory device with a code signal generated based on a temperature signal generated by sensing change of an operating temperature of the semiconductor memory device, wherein the refresh control circuit is configured to change a refresh interval in response to the code signal.

18. The memory system of claim 15, wherein the refresh control circuit is configured to:

perform the refresh operation on one or more weak pages of the memory cell rows at least two times during the refresh period, each of the one or more weak pages including at least one weak cell whose data retention time is smaller than a normal cell;

perform a weak self-refresh operation on the one or more weak pages in parallel with a normal self-refresh operation on the memory cell rows during the refresh period; or perform the weak self-refresh operation on the one or more weak pages after the normal self-refresh operation on the memory cell rows is completed during the refresh period.

19. A method of operating a memory system including a memory controller and a semiconductor memory device having a memory cell array that includes a plurality of bank arrays, each including a plurality of dynamic memory cells, the method comprising:

transmitting, by the memory controller, one or more command pairs of a self-refresh entry command and a self-refresh exit command to the semiconductor memory device during a refresh period; and performing, by a refresh control circuit of the semiconductor memory device, a refresh operation on all of bank arrays during the refresh period in a self-refresh mode, in response to each self-refresh entry command of the one or more command pairs, wherein, for each of the one or more command pairs, transmitting the one or more command pairs comprises transmitting sequentially during the refresh period, at least one self-refresh entry command and at least one self-refresh exit command to the semiconductor memory device separated by one or more time gaps, wherein a first period of time equal to the sum of the one or more time gaps is predetermined, and wherein the performing of the refresh operation on all of the bank arrays during the refresh period in a self-refresh mode includes performing the refresh operation simultaneously on all of the bank arrays when the self-refresh entry command corresponds to an all-bank refresh command designating the refresh operation on all of the bank arrays.

* * * * *